United States Patent
Paeng et al.

(10) Patent No.: US 11,984,330 B2
(45) Date of Patent: May 14, 2024

(54) ATOMIC LAYER ETCH AND DEPOSITION PROCESSING SYSTEMS INCLUDING A LENS CIRCUIT WITH A TELE-CENTRIC LENS, AN OPTICAL BEAM FOLDING ASSEMBLY, OR A POLYGON SCANNER

(71) Applicant: LAM RESEARCH CORPORATION, Fremont, CA (US)

(72) Inventors: Dong Woo Paeng, Albany, CA (US); Yunsang S. Kim, Monte Sereno, CA (US); He Zhang, Fremont, CA (US); Keith Wells, Santa Cruz, CA (US); Alan M. Schoepp, Ben Lomond, CA (US)

(73) Assignee: Lam Research Corporation, Fremont, CA (US)

( * ) Notice: Subject to any disclaimer, the term of this patent is extended or adjusted under 35 U.S.C. 154(b) by 800 days.

(21) Appl. No.: 17/053,110

(22) PCT Filed: May 2, 2019

(86) PCT No.: PCT/US2019/030304
§ 371 (c)(1),
(2) Date: Nov. 5, 2020

(87) PCT Pub. No.: WO2019/217180
PCT Pub. Date: Nov. 14, 2019

(65) Prior Publication Data
US 2021/0143032 A1    May 13, 2021

Related U.S. Application Data

(60) Provisional application No. 62/767,574, filed on Nov. 15, 2018, provisional application No. 62/668,552, filed on May 8, 2018.

(51) Int. Cl.
*H01L 21/67* (2006.01)
*C23C 16/455* (2006.01)
(Continued)

(52) U.S. Cl.
CPC .. *H01L 21/67115* (2013.01); *C23C 16/45544* (2013.01); *G02B 27/0927* (2013.01);
(Continued)

(58) Field of Classification Search
CPC ......... H01L 21/67115; H01L 21/67069; H01L 21/67109; H01L 21/67248;
(Continued)

(56) References Cited

U.S. PATENT DOCUMENTS

2003/0021307 A1   1/2003  Yamazaki
2004/0074881 A1   4/2004  Oishi
(Continued)

FOREIGN PATENT DOCUMENTS

JP   2001044134 A     2/2001
JP   2004090534 A  *  3/2004   ....... H01L 21/67092
(Continued)

OTHER PUBLICATIONS

International Search Report and Written Opinion of the ISA issued in PCT/US2019/030304, dated Aug. 14, 2019; ISA/KR.
(Continued)

*Primary Examiner* — Wyatt A Stoffa
*Assistant Examiner* — Ray Alexander Dean

(57) ABSTRACT

A substrate processing system includes a processing chamber, a substrate support, a laser, and a collimating assembly. The substrate support is disposed in the processing chamber and is configured to support a substrate. The laser is configured to generate a laser beam. The collimating assembly includes lenses or mirrors arranged to direct the laser beam at the substrate to heat an exposed material of the substrate.

(Continued)

The lenses or mirrors are configured to direct the laser beam in a direction within a predetermined range of being perpendicular to a surface of the substrate.

26 Claims, 25 Drawing Sheets

(51) Int. Cl.
    *G02B 27/09*     (2006.01)
    *G02B 27/30*     (2006.01)
    *G02F 1/11*     (2006.01)
    *H01J 37/32*     (2006.01)

(52) U.S. Cl.
    CPC ..... *G02B 27/0944* (2013.01); *G02B 27/0955* (2013.01); *G02B 27/30* (2013.01); *G02F 1/11* (2013.01); *H01J 37/321* (2013.01); *H01J 37/32449* (2013.01); *H01J 37/32715* (2013.01); *H01L 21/67069* (2013.01); *H01J 2237/332* (2013.01); *H01J 2237/334* (2013.01)

(58) Field of Classification Search
    CPC ......... H01L 21/67103; H01L 21/67276; H01L 21/67017; H01L 21/67098; H01L 21/67253; H01L 21/683; C23C 16/45544; G02B 27/0927; G02B 27/0944; G02B 27/0955; G02B 27/30; G02F 1/11; H01J 37/321; H01J 37/32449; H01J 37/32715; H01J 2237/332; H01J 2237/334; H01S 3/0007

See application file for complete search history.

(56) References Cited

U.S. PATENT DOCUMENTS

| | | | |
|---|---|---|---|
| 2005/0170572 A1* | 8/2005 | Hongo | B23K 26/0853 |
| | | | 250/341.1 |
| 2008/0164240 A1* | 7/2008 | Cordingley | B23K 26/40 |
| | | | 219/121.61 |
| 2009/0323739 A1 | 12/2009 | Elliott et al. | |
| 2010/0171931 A1 | 7/2010 | Kessler et al. | |
| 2013/0137267 A1 | 5/2013 | Chang et al. | |
| 2013/0192310 A1 | 8/2013 | Nakamura | |
| 2014/0273416 A1 | 9/2014 | Moffatt | |
| 2016/0027697 A1 | 1/2016 | Lei et al. | |
| 2017/0032865 A1 | 2/2017 | Ranish et al. | |
| 2017/0221781 A1 | 8/2017 | Theisen et al. | |

FOREIGN PATENT DOCUMENTS

| | | | | |
|---|---|---|---|---|
| JP | 2013157376 A | | 8/2013 | |
| JP | 2016149573 A | | 8/2016 | |
| JP | 2017528326 A | | 9/2017 | |
| KR | 100799500 B1 * | | 1/2008 | .......... G02B 26/105 |
| WO | WO-2016126912 A1 | | 8/2016 | |
| WO | WO-2016205805 A1 | | 12/2016 | |
| WO | WO-2016208790 A1 * | | 12/2016 | ......... H01L 21/0203 |
| WO | WO-2017151958 A1 | | 9/2017 | |
| WO | WO-2018022441 A1 | | 2/2018 | |
| WO | WO-2018074281 A1 * | | 4/2018 | .......... B23K 26/082 |

OTHER PUBLICATIONS

Office Action issued in corresponding Japanese Patent Application 2020-562571 dated Apr. 4, 2023.

* cited by examiner

ATOMIC LAYER ETCH AND DEPOSITION PROCESSING SYSTEMS INCLUDING A LENS CIRCUIT WITH A TELE-CENTRIC LENS, AN OPTICAL BEAM FOLDING ASSEMBLY, OR A POLYGON SCANNER

CROSS-REFERENCE TO RELATED APPLICATIONS

This application is a U.S. National Phase Application under 35 U.S.C. 371 of International Application No. PCT/US2019/030304, filed on May 2, 2019, which claims the benefit of U.S. Provisional Application No. 62/767,574, filed on Nov. 15, 2018 and U.S. Provisional Application No. 62/668,552, filed on May 8, 2018. The entire disclosures of the applications referenced above are incorporated herein by reference.

FIELD

The present disclosure relates to substrate etching and deposition processes, and more particularly to atomic layer etching and deposition.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During atomic layer etching (ALE) of a substrate, such as a semiconductor wafer, a reactant (e.g., chlorine ($CL_2$) gas) is introduced into a processing chamber to modify a surface of the substrate. A chlorine-based gas is often used during ALE of silicon (Si), germanium (Ge) and metal oxides ($MO_x$) to provide a chlorine infused top layer. As an example, a chlorine gas may be introduced to convert a top portion of a silicon substrate from being formed of Si to being a layer of silicon chloride ($SiCl_x$), where x is 1, 2, 3, or 4. After surface modification, the chlorine gas is purged from the chamber. An argon (Ar) plasma is provided to perform ion bombardment and actively remove the silicon chloride reactive layer followed by purging of by-products.

SUMMARY

A substrate processing system is provided and includes a processing chamber, a substrate support, a laser, and a collimating assembly. The substrate support is disposed in the processing chamber and is configured to support a substrate. The laser is configured to generate a laser beam. The collimating assembly includes lenses or mirrors arranged to direct the laser beam at the substrate to heat an exposed material of the substrate. The lenses or mirrors are configured to direct the laser beam in a direction within a predetermined range of being perpendicular to a surface of the substrate.

In other features, substrate processing system further includes a lens circuit including beam-shaping optics to convert the laser beam from a round-shaped laser beam to a square-shaped laser beam.

In other features, substrate processing system further includes a lens circuit including: flat-top optics to convert the laser beam from a round-shaped laser beam to a flat-top shaped laser beam; and diffractive optics to convert the flat-top shaped laser beam to a square-shaped laser beam.

In other features, substrate processing system further includes a controller configured to perform a rapid thermal annealing process including (i) generating a control signal to modulate the laser beam to subject the exposed material to thermal energy pulses, and (ii) allowing the exposed material to cool between consecutive ones of the thermal energy pulses. In other features, substrate processing system further includes a mirror circuit including a first mirror, a second mirror, a first motor and a second motor. The controller is configured to move the first mirror and the second mirror via the first motor and the second motor to adjust a position of the laser beam on the substrate.

In other features, substrate processing system further includes a beam size adjustment device configured to adjust a size of the laser beam prior to being received by the substrate.

In other features, the collimating assembly includes a tele-centric lens assembly including the lenses arranged to direct the laser beam at the substrate to heat the exposed material. The lenses are configured to direct the laser beam in a direction perpendicular to the surface of the substrate. The lenses are configured to direct the laser beam in a direction perpendicular to the surface of the substrate. In other features, substrate processing system further includes a mirror circuit and a controller. The mirror circuit includes a first mirror, a second mirror, a first motor and a second motor. The laser beam is directed at the first mirror. The laser beam is directed from the first mirror to the second mirror. The laser beam is directed from the second mirror through the tele-centric lens assembly and to the substrate. The controller is configured to move the first mirror and the second mirror via the first motor and the second motor to adjust a position of the laser beam on the substrate.

In other features, the lenses maintain the laser beam in a perpendicular relationship with the surface of the substrate while the controller adjusts the position of the laser beam on the substrate.

In other features, the processing chamber is an inductively coupled plasma chamber or a remote plasma source connected chamber. The tele-centric lens assembly is disposed above a dielectric window of the processing chamber. In other features, the lenses are plano-convex lenses. In other features, the lenses have different diameters.

In other features, the lenses are arranged in a series including a first lens and a last lens. The lenses increase in diameter from the first lens to the last lens. In other features, the laser beam is received at the first lens and is output from the last lens to the substrate.

In other features, the collimating assembly includes an optical beam folding assembly including the mirrors arranged to direct the laser beam at the substrate to heat the exposed material. The lenses are configured to direct the laser beam in a direction perpendicular to the surface of the substrate. The mirrors are arranged to reflect and direct the laser beam in a direction within the predetermined range of being perpendicular to the surface of the substrate.

In other features, the substrate processing system further includes a controller configured to control the laser to pulse the laser beam at a predetermined frequency.

In other features, the substrate processing system further includes a gas delivery system and a controller. The gas delivery system is configured to supply a process gas to the processing chamber. The controller is configured to control the gas delivery system and the laser to iteratively perform an isotropic atomic layer etch process. The process including: during an iteration of the isotropic atomic layer etch process, performing pretreatment, atomistic adsorption, and pulsed thermal annealing; during the atomistic adsorption, exposing the surface of the substrate to the process gas including a halogen species that is selectively adsorbed onto the exposed material of the substrate to form a modified material; and during the pulsed thermal annealing, pulsing the laser on and off multiple times within a predetermined period to expose and remove the modified material.

In other features, the substrate processing system further includes an acousto-optic modulator configured to receive the laser beam; and a controller configured to generate a radio frequency signal. The laser is configured to operate in a continuous mode. The acousto-optic modulator is configured to, based on the radio frequency signal and at a predetermined frequency, switch between permitting passage and preventing passage of the laser beam to the lenses or mirrors.

In other features, the collimating assembly includes an optical beam folding assembly including the mirrors arranged to direct the laser beam at the substrate to heat the exposed material. The lenses are configured to direct the laser beam in a direction perpendicular to the surface of the substrate. The mirrors are arranged to reflect and direct the laser beam in a direction within the predetermined range of being perpendicular to the surface of the substrate.

In other features, the substrate processing system further includes a gas delivery system configured to supply a process gas to the processing chamber. The controller is configured to control the gas delivery system and the laser to iteratively perform an isotropic atomic layer etch process. The process includes: during an iteration of the isotropic atomic layer etch process, performing pretreatment, atomistic adsorption, and pulsed thermal annealing; during the atomistic adsorption, exposing the surface of the substrate to the process gas including a halogen species that is selectively adsorbed onto the exposed material of the substrate to form a modified material; and during the pulsed thermal annealing, generate the radio frequency signal to modulate the laser beam within a predetermined period to expose and remove the modified material.

In other features, a substrate processing system is provided that includes a processing chamber, a substrate support, a laser, a lens circuit and at least one of a mirror or a polygon scanner. The substrate support is disposed in the processing chamber and configured to support a substrate. The laser is configured to generate a round-shaped laser beam. The lens circuit is configured to convert the round-shaped laser beam to a line beam. At least one of a mirror or a polygon scanner arranged to direct the line beam at the substrate to heat an exposed material of the substrate.

In other features, the at least one of the mirror or the polygon scanner is configured to direct the line beam in a direction within a predetermined range of being perpendicular to the surface of the substrate.

In other features, the lens circuit includes: flat-top optics configured to convert the round-shaped laser beam to a flat-top shaped laser beam; and beam shaping optics configured to convert the flat-top shaped laser beam to the line beam.

In other features, the polygon scanner includes sides. Each of the sides is implemented as a mirror or includes a mirror. In other features, the substrate processing system further includes: a motor connected to and configured to rotate the polygon scanner; and a controller configured to control operation of the motor to rotate the polygon scanner to move the line beam across the surface of the substrate.

In other features, the substrate processing system further includes: a motor connected to and configured to rotate the mirror; and a controller configured to control operation of the motor to rotate the mirror to move the line beam across the surface of the substrate.

In other features, the substrate processing system further includes: a gas delivery system configured to supply a process gas to the processing chamber; and a controller configured to control the gas delivery system and the laser to iteratively perform an isotropic atomic layer etch process. The process includes: during an iteration of the isotropic atomic layer etch process, performing pretreatment, atomistic adsorption, and pulsed thermal annealing; during the atomistic adsorption, exposing the surface of the substrate to the process gas including a halogen species that is selectively adsorbed onto the exposed material of the substrate to form a modified material; and during the pulsed thermal annealing, pulsing the laser on and off multiple times within a predetermined period to expose and remove the modified material.

In other features, the substrate processing system further includes: an acousto-optic modulator configured to receive the laser beam; and a controller configured to generate a radio frequency signal. The laser is configured to operate in a continuous mode. The acousto-optic modulator is configured to, based on the radio frequency signal and at a predetermined frequency, switch between permitting passage and preventing passage of the laser beam to the polygon scanner. In other features, the substrate processing system further includes a gas delivery system configured to supply a process gas to the processing chamber. The controller is configured to control the gas delivery system and the laser to iteratively perform an isotropic atomic layer etch process. The process includes: during an iteration of the isotropic atomic layer etch process, performing pretreatment, atomistic adsorption, and pulsed thermal annealing; during the atomistic adsorption, exposing the surface of the substrate to the process gas including a halogen species that is selectively adsorbed onto the exposed material of the substrate to form a modified material; and during the pulsed thermal annealing, generate the radio frequency signal to modulate the laser beam within a predetermined period to expose and remove the modified material.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
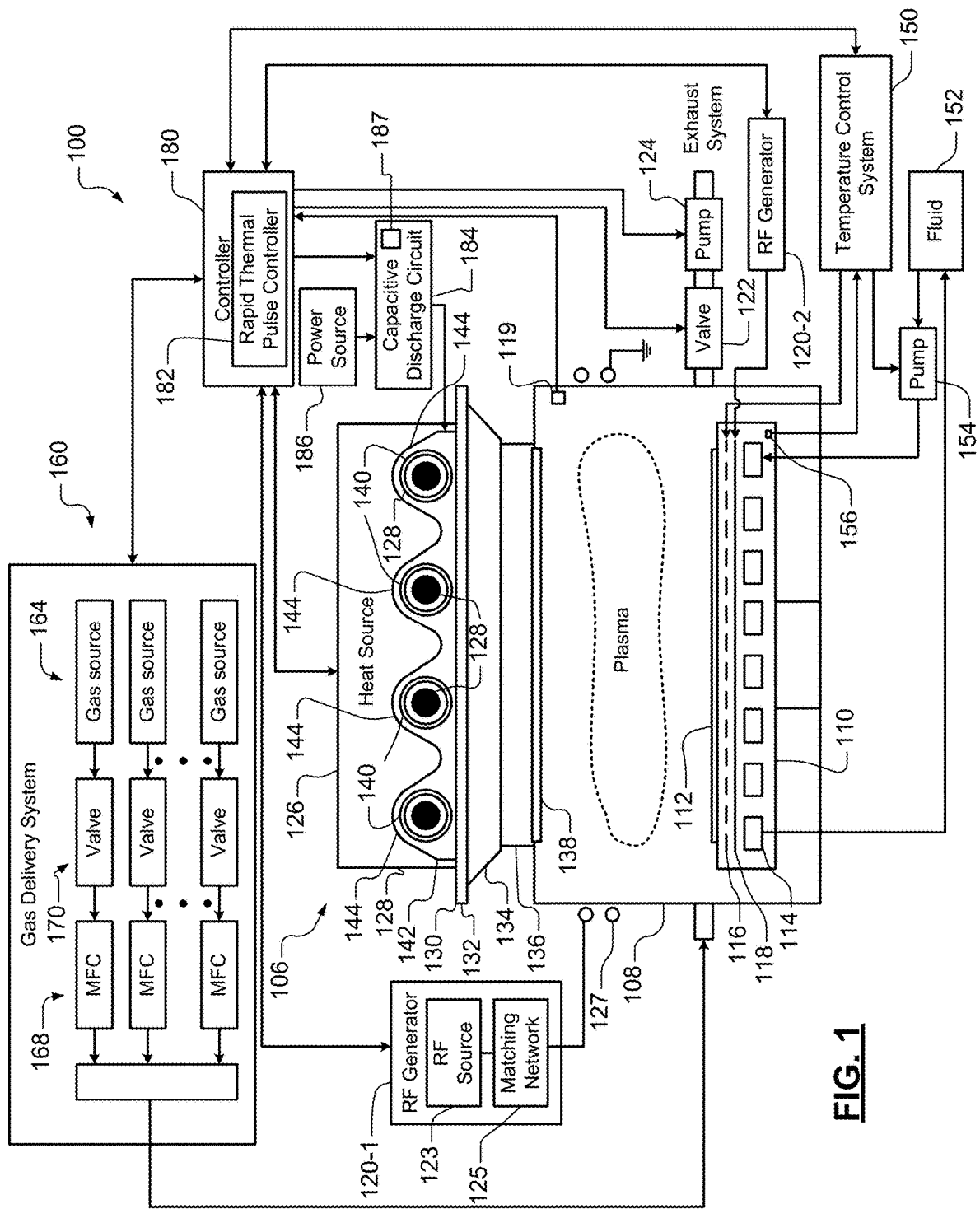
FIG. 1 a functional block diagram of an example of a substrate processing system incorporating a flash lamp and a rapid thermal pulse controller for performing rapid thermal pulse operations during ALE and atomic layer deposition (ALD) in accordance with the present disclosure.

To fabricate sub-7 nanometer (nm) devices, isotropic removal of material from a substrate with nano-scale control is needed. At the nano-scale level, traditional dry etching and wet etching can cause substrate surface roughness and/or damage. In addition, ALE is limited in isotropic removal due to ion directionality. In order to remove, for example, an upper portion of a substrate, the upper portion may be modified to provide an upper volatile layer. The upper volatile layer may then be removed by heating the upper volatile layer via a lamp. A traditional lamp (e.g., infrared lamp) may heat a portion of a substrate, for example, at 40-250° C./second. Time for the lamp to heat the upper volatile layer and for the upper volatile layer to cool down can take several minutes. The amount of time needed to heat up and cool down the substrate can be based on the heating and cooling rates of a substrate support, such as an electrostatic chuck. Time for the substrate and the substrate support to heat up and cool down can take tens of minutes.

Due to the lengthy period to heat the substrate, the entire substrate including a base or bulk portion of the substrate is typically heated. As a result, traditional heating by turning on a heating lamp for an extended period of time has thermal budget issues due to the heating of a bulk portion of a substrate and not heating only an upper portion and/or surface of the substrate. This type of heating has limited use to certain etching processes. The thermal budget refers to an amount of time a substrate is able to be exposed to particular temperatures without: degrading materials and/or make-up of the substrate; negatively affecting performance and/or operation of die components on the substrate; and/or causing inter-diffusion issues, where molecules and/or atoms of one species layer are diffused into another species layer. The higher the temperature and the longer the exposure, the more likely and the more prevalent the thermal budget issues. As an example, using a traditional heating lamp, a thermal cycle providing temperature increases greater than 200° C. can result in Si diffusion into Ge, while a thermal cycle having a temperature increase of 40° C. may not result in Si diffusion into Ge. The thermal budget issues limit processes that are able to be performed on a substrate, especially within a single processing chamber. In order to avoid waiting for a substrate support to cool down and to quickly perform different processes, a substrate may need to be moved between processing chambers.

The examples set forth herein include rapid thermal pulsing (RTP) systems for performing RTP cycles via heat sources to rapidly increase temperatures of upper portions of substrates. By rapidly heating the upper portions and not heating bases or bulk portions of the substrates, the upper portions of the substrates are able to rapid decrease in temperature after the heat sources are deactivated. Multiple heating and cooling cycles may be performed as described below in a few seconds. The RTP is provided and prevents thermal budget issues. In other words, thermal heating is provided without heating and/or minimizing the amount of heating of a lower bulk portion of a substrate. This allows for rapid heating and cooling of a surface and/or upper portions of a substrate to rapidly perform multiple cycles of a process, and/or multiple different processes within a single processing chamber. As an example, the upper portions may be a few hundred nanometers thick (or depth of heating is a few hundred nanometers into the substrate) and measured from a heated surface of the substrate.

The RTP operations also enable performance of processes that were previously not performed due to sensitivity to thermal budget issues. As an example, isotropic and selective removal of certain film materials from substrates may be performed. The film materials that may be removed include silicon, germanium, metal oxides such as aluminum oxide, titanium oxide, and zirconium oxide, and other materials such as titanium nitride, etc.

Referring now to FIG. 1, an example of a substrate processing system 100 that can be used is shown. While the substrate processing system 100 includes an inductively coupled plasma (ICP) source, other types of processing chambers and/or plasma sources (such as remote plasma sources) may be used. A remote plasma source may optionally be provided to utilize radicals. An example of another processing chamber is a remote plasma source connected chamber (or first chamber) that is connected to another processing chamber (or second chamber). The substrate processing system 100 includes an RTP system 106 and a processing chamber 108. The processing chamber 108 includes a substrate support 110 for supporting a substrate 112. The RTP system 106 rapidly and iteratively heats a surface and/or a portion of the substrate 112. In some examples, the substrate support 110 includes an electrostatic chuck or vacuum chuck. In some examples, the substrate support 110 is temperature controlled. For example, the substrate support 110 may include fluid channels 114 and/or heaters 116, which may be arranged in one or more zones. The substrate support 110 may further include an electrode 118.

One or more sensors 119 such as temperature and/or pressure sensors may be arranged in the processing chamber 108 to sense temperature and/or pressure, respectively. A valve 122 and pump 124 may be used to control pressure within the processing chamber 108 and/or to evacuate reactants from the processing chamber 108.

Figure 2:
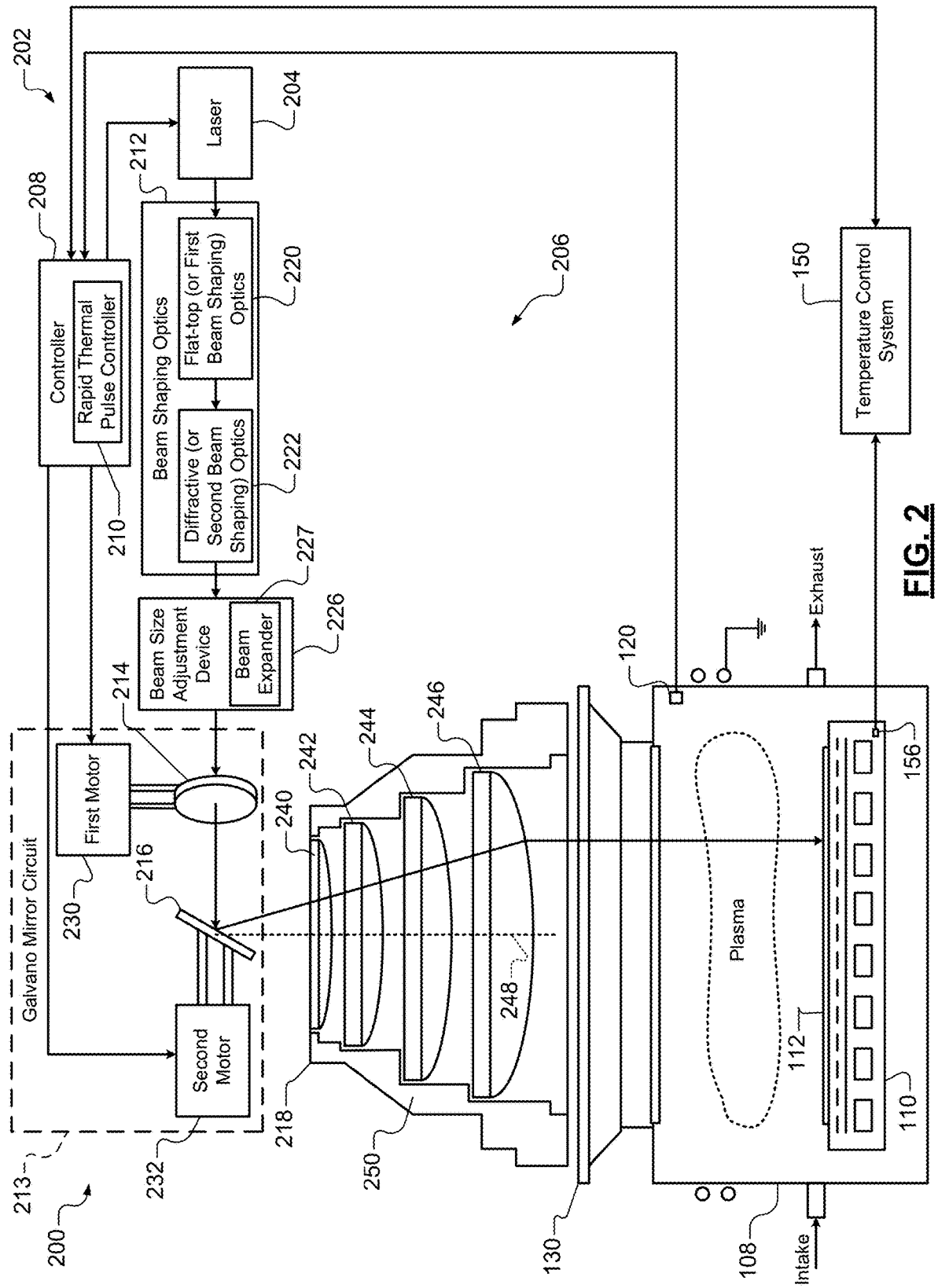
FIG. 2 a functional block diagram of an example of a substrate processing system incorporating a laser, a lens circuit and a rapid thermal pulse controller for performing rapid thermal pulse operations during ALE and ALD in accordance with the present disclosure.

The RTP system 106 includes a heat source 126 that performs rapid thermal annealing of the substrate 112. This includes RTP via flash lamps 128. An example of another RTP system that is laser based is shown in FIG. 2. A window assembly 130 may be disposed between the heat source 126 and the processing chamber 108. The window assembly 130 includes a first (or dielectric) window 132, a reflector 134, a coupling member 136 and a second window 138. The first window 132 may be a quartz window. The reflector 134 may be formed of stainless steel and may be conical-shaped to direct thermal energy generated by the flash lamps 128 towards the substrate 112. The second window 138 may be a sapphire window. The coupling member 136 connects the reflector 134 to the processing chamber 108. In one embodiment, the reflector 134 is not included and the first window 132 is attached to the coupling member 136. The flash lamps 128 may be cylindrically-shaped and include respective cooling jackets 140 through which water and/or other cooling fluid may be circulated to cool the flash lamps 128. A reflector 142 having parabolic reflective portions 144 may be disposed on the first window 132. The reflector 142 may be formed of aluminum. The flash lamps 128 are disposed respectively in the parabolic reflective portions 144 between the reflector 142 and the first window 132.

A temperature control system 150 may be used to control a temperature of the substrate support 110 and the substrate 112. The temperature control system 150 may control supply of a fluid from a fluid source 152 via a pump 154 that is connected to the fluid channels 114. The temperature control system 150 may also control operation of the heaters 116. The temperature control system 150 may include one or more temperature sensors 156 to sense temperatures of one or more locations or zones of the substrate support 110.

A gas delivery system 160 includes one or more gas sources 164, one or more valves 106, one or more mass flow controllers 168 and a mixing manifold 170. The gas delivery system 160 selectively supplies a plasma gas mixture, carrier and/or inert gases, and/or a purge gas mixture to the processing chamber 108 during pretreatment, doping, passivation, annealing and/or purging.

An RF generator 120-1 includes an RF source 123 and a matching network 125 that outputs RF power to a coil 127, which surrounds an outer wall of the processing chamber 108. The RF generator 120-1 creates a magnetic field in the processing chamber 108 that strikes plasma. Another RF generator 120-2 may be used to supply an RF bias to the electrode 118 in the substrate support 110. A controller 180 communicates with the one or more sensors 119, the valve 122 and pump 124, the temperature control system 150, the heat source 126, the RF generators 120-1 and/or 120-2, and the gas delivery system 160 to control the process being performed.

The controller 180 may include a RTP controller 182, which controls a capacitive discharge circuit 184 to pulse the flash lamps 128. The capacitive discharge circuit 184 may receive power from a power source 186 and a control signal from the RTP controller 182. The capacitive discharge circuit 184 may charge capacitors (represented by box 187) when in an idle mode and may discharge the capacitors upon receiving a discharge signal from the RTP controller 182. The RTP controller 182 may perform RTP operations during ALE and/or ALD processes.

FIG. 2 shows an example of a substrate processing system 200 incorporating a RTP system 202 including a laser 204, a lens circuit 206 and a controller 208 with a RTP controller 210. The substrate processing system 200 may operate similar to the substrate processing system 100 of FIG. 1 and include portions of the substrate processing system 100 not shown in FIG. 2. The substrate processing system 200 includes the laser 204, the lens circuit 206, and the controller 208 instead of the heat source 126, the controller 180, and the capacitive discharge circuit 184. The laser 204 is a heat source that may be pulsed (or modulated) by the RTP controller 210 during RTP operations based on a control signal received from the RTP controller 210. This may occur during ALE and ALD processes.

The lens circuit 206 includes beam shaping optics 212, a Galvano mirror circuit 213 that includes a first mirror 214 and a second mirror 216, and a tele-centric lens assembly 218. The beam shaping optics 212 may include flat-top (or first beam shaping) optics 220 and diffractive (or second beam shaping) optics 222. The flat-top optics 220 are used to convert a laser beam received from the laser 204, where the laser beam has a Gaussian distribution, into a flat-top beam (e.g., a 2 centimeter (cm)×2 cm flat-top beam). A temperature profile of the laser beam is also Gaussian. An example of a flat-top optic is a "flywheel" optic.

The diffractive optics 222 convert the flat-top circular beam out of the flat-top optics 220 to a square beam. The square beam has a corresponding uniform temperature distribution on a substrate. This allows for a uniform thermal reaction and/or etch rate over the portion of a substrate (e.g., substrate 112) exposed to the square beam. Providing a square beam also provides a beam with a shape that matches a shape of a die being heated. The square beam may uniformly heat a surface or an upper portion of a selected die. The substrate 112 may be disposed on the substrate support in the processing chamber 108.

A beam size adjustment device 226 may be disposed between the beam shaping optics 212 and the first mirror 214. The beam size adjustment device 226 may adjust a size of the square beam to be greater than or equal to a size of a die on the substrate 112. The beam size adjustment device 226 may be motorized and include a beam expander 227. The beam expander 227 may perform magnification and increase a size of the laser beam.

The RTP controller 210 and the Galvano mirror circuit 113 may operate as a X-Y galvanometer scanning system. The first mirror 214 may be used to move the laser beam across a surface of the substrate 112 in a first (or X) direction. The second mirror 216 may be used to move the laser beam across the surface of the substrate in a second (or Y) direction. The controller 208 and/or the RTP controller 210 may move the mirrors 214, 216 via motors 230, 232.

The tele-centric lens assembly 218 may be referred to as a collimating assembly and includes a series of plano-convex lenses 240, 242, 244, 246. Although a particular number of plano-convex lenses are shown, a different number of plano-convex lenses may be included. The diameter of the plano-convex lenses 240, 242, 244, 246 increases the closer the plano-convex lens is to the window assembly 130, such that: a diameter of the lens 242 is larger than a diameter of the lens 240; a diameter of the lens 244 is larger than the diameter of the lens 242; and a diameter of the lens 246 is larger than the diameter of the lens 244. The plano-convex lenses 240, 242, 244, 246 are vertically aligned to have a common centerline 248. The plano-convex lenses 240, 242, 244, 246 are held in a fixed relationship within a mold 250. The plano-convex lenses 240, 242, 244, 246 direct the laser beam received from the second mirror 216 to be orthogonal to the surface of the substrate 112. As the laser beam is moved across the surface of the substrate 112, the tele-centric lens assembly 218 maintains the laser beam in an orthogonal relationship with the surface of the substrate 112.

As an example, the laser beam generated by the laser 204 may be 355 nm in diameter and may be pulsed every 80 picoseconds (ps). The RTP controller 210 may move the mirrors 214, 216 to perform 150 Hertz (Hz) scan across the surface of the substrate 112.

The substrate processing system 200 may include the temperature control system 150, which may be used to control a temperature of the substrate support 110 and the substrate 112. The temperature control system 150 may include the one or more temperature sensors 156 to sense temperatures of one or more locations or zones of the substrate support 110.

Figure 3:
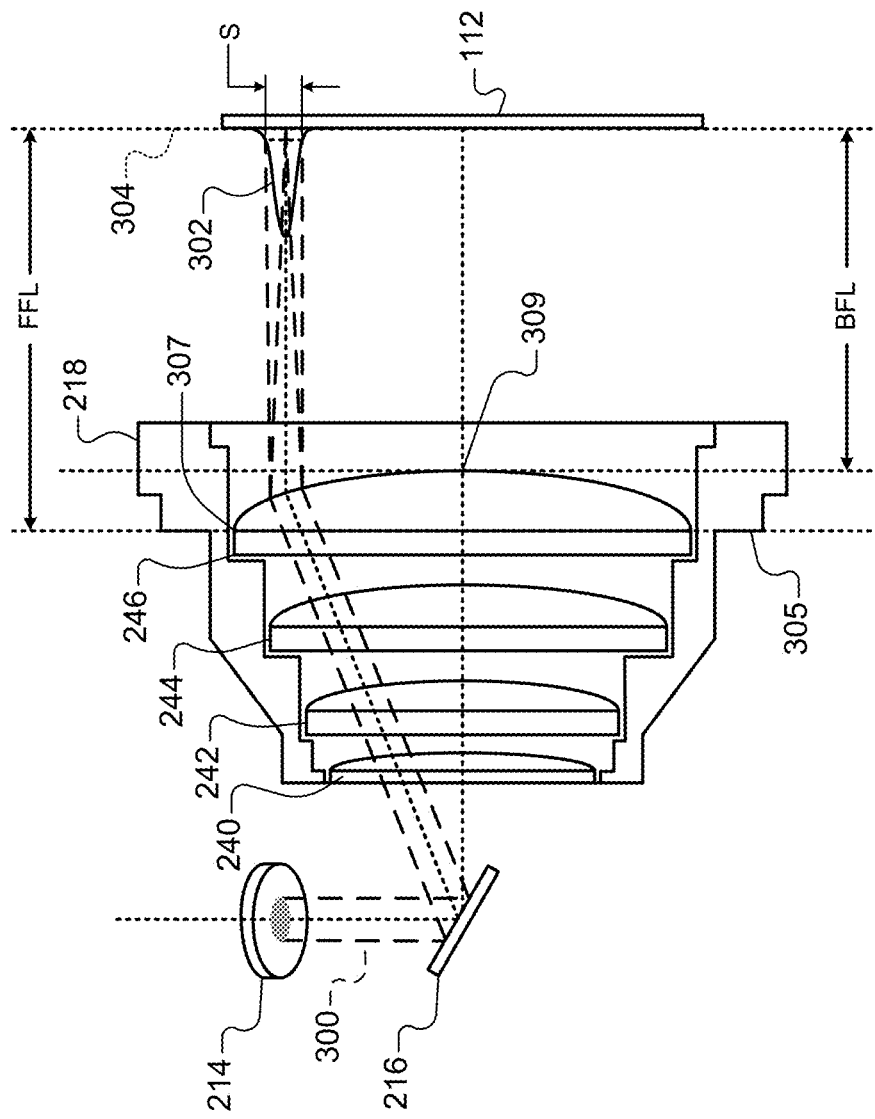
FIG. 3 is a side cross-sectional view of mirrors and a tele-centric lens assembly incorporated in the lens circuit of FIG. 2.

FIG. 3 shows a side cross-sectional view of the mirrors 214, 216 and the tele-centric lens assembly 218 of FIG. 2. The mirrors 214, 216 are shown and direct a laser beam 300 through the tele-centric lens assembly 218. The laser beam 300 is passed through the lenses 240, 242, 244, 246 from the smallest lens 240 to the largest lens 246. When the laser beam 300 is round and does not pass through the beam shaping optics 212 of FIG. 2, the laser beam has a Gaussian distribution as represented by curve 302 on an image plane 304 or surface of the substrate 112. When the laser beam 300 passes through the beam shaping optics 212, the laser beam is square shaped and has a spot with sides S.

The Galvano mirror circuit 213 of FIG. 2 provides a system including 2 mirrors for scanning a full field-of-view (FOV). As an example, the FOV may be greater than 300 mm×300 mm. In one embodiment, the lenses 240, 242, 244, 246 collectively have a low numerical aperture (less than a predetermined numerical aperture) and a focal column parameter (or beam perpendicularity parameter) within a predetermined range of being perpendicular relative to the image plane 304. The laser beam is provided perpendicular to the image plane without beam distortion at the image plane while beam uniformity and intensity is maintained. The laser beam may be focused on the image plane 304. In one embodiment, the pupil aperture or size of a side S of the beam spot is limited to 10-12 mm. The beam size adjustment device 226 of FIG. 2 may increase the size of the beam spot, such that S is 20-22 mm.

A flange focal length (FFL) and a back focal length (BFL) are shown. The FFL may be a distance from (i) an end of a flange 305 and/or a point 307 where the lens 246 begins to curve and protrude outward towards the image plane 304, and (ii) the image plane 304. The BFL may refer to a distance from (i) a point 309 on the lens 246 closest to the image plane 304, and (ii) the image plane 304.

The above-described examples of FIGS. 1-3 provide a flash lamp example and a laser beam example. The flash lamps may be modulated (or pulsed) every predetermined number of micro-seconds (e.g., every 300 μs) and the laser beam may be modulated (or pulsed) every predetermined number of pico-seconds (e.g., every 80 ps). The examples allow for performing a sequential thermal ALE or ALD process. As an example, a 100 μs pulsed light source may be used providing 8 Joules (J) of lamp power per centimeter squared ($cm^2$) with a 1 Hz cycle. Greater than 50 cycles may be performed for a single recipe within a single processing chamber. An ALE process may be performed including atomistic and isotropic removal of material. These processes are efficiently performed while controlling substrate temperatures without thermal budget issues.

Figure 4:
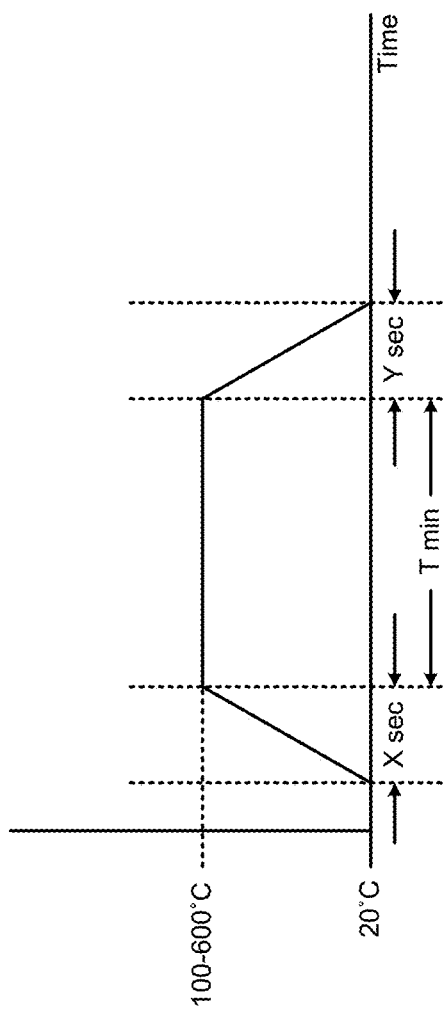
FIG. 4 is a temperature profile over time illustrating an example heating ramp up and cool down period associated with a traditional continuous wave mode of operation.

FIG. 4 shows a temperature profile over time illustrating an example heating ramp up and cool down period associated with a traditional continuous wave mode of operation. As shown, a traditional heating lamp operating in the continuous wave mode may heat a substrate from 20° C. to 100-600° C. in x seconds. The heating lamp may be ON for t minutes. The substrate may cool down in y seconds.

Figure 5:
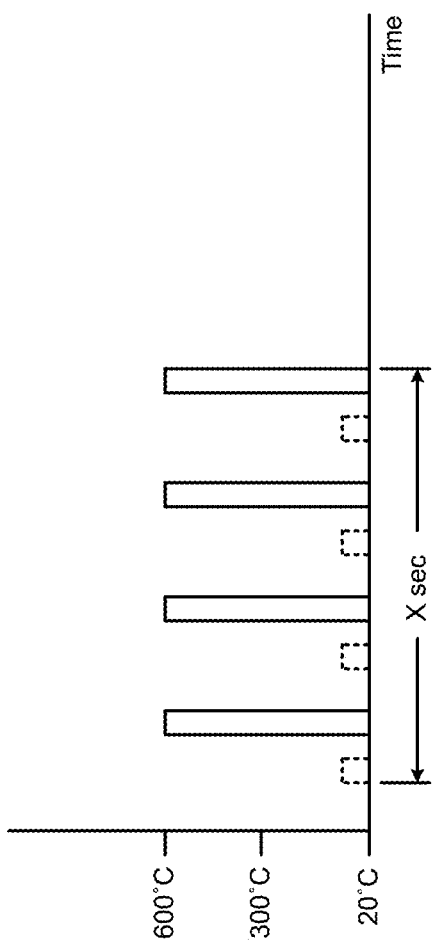
FIG. 5 is an example temperature profile over time illustrating example rapid thermal pulses in accordance with the present disclosure.

FIG. 5 shows an example temperature profile over time illustrating example rapid thermal pulses. In FIG. 5, low temperature pulses and high temperature pulses are shown for example purposes. As an example, the low temperature pulses may be provided to increase temperatures of a portion of a substrate to 80° C. per cycle. The high temperature pulses may increase temperatures of the portion of the substrate to 600° C. per cycle. In one embodiment, the low temperature pulses increase temperatures of the portion of the substrate to 20-80° C. In one embodiment, the high temperature pulses increase temperatures of the portion of the substrate to 100-600° C. In another embodiment, the low temperature pulses are not provided. The portion of the substrate being heated is cooled down for example to a baseline temperature (e.g., 20° C.) between each consecutive pair of the low temperature pulses and/or the high temperature pulses. Multiple low temperature and/or high temperature pulses may be provided and the portion of the substrate being heated may cool down between sequential ones of the pulses over a predetermined number of seconds (shown as x seconds). As an example, multiple low temperature pulses and high temperature pulses may be provided over a 3-10 second long period.

The RTP described herein allows for heating and controlling substrate surface temperatures. Heating is provided to predetermined depths of a substrate in a controlled and tunable manner while providing atomistic reaction control. This may be accomplished by controlling the number, length, intensity, and frequency of the light (e.g., flash lamp or laser) pulses being generated. In one embodiment, a series of high temperature pulses are provided. In other embodiment, a series of low temperature pulses are provided. In another embodiment, a combination of low temperature and high temperature pulses are provided and the durations, intensities (or power levels) and frequencies of the pulses are controlled to provide a temperature depth profile across at least a portion of a surface of a substrate. By having multiple flash lamps as in the embodiment of FIG. 1, different temperature zones may be created by operating the flash lamps differently. For example, a first one or more of the flash lamps may be operated to provide a first series of pulses having a first set of one or more durations, one or more intensity levels (or power levels) and one or more frequencies and a second one or more of the flash lamps may be operated to provide a second series of pulses having a second set of one or more durations, one or more intensity levels (or power levels) and one or more frequencies.

Figure 6:
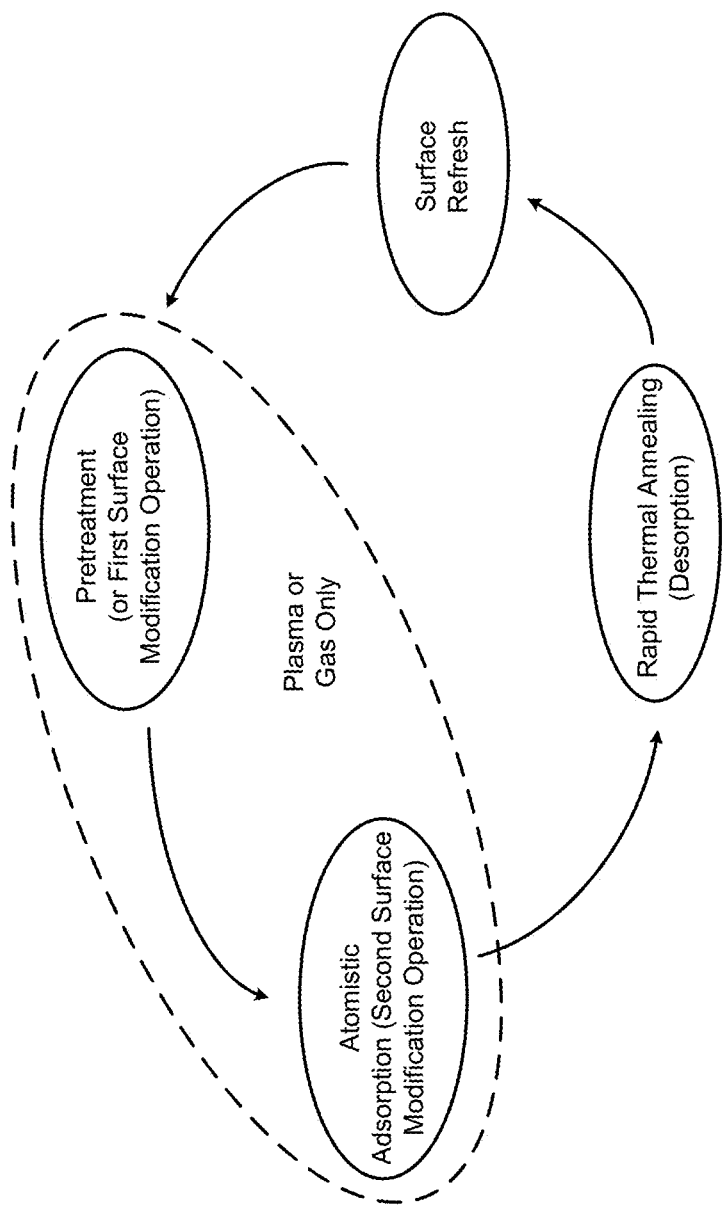
FIG. 6 is a ALE process diagram in accordance with the present disclosure.

FIG. 6 shows an ALE process diagram illustrating a thermal ALE process performed in accordance with the present disclosure. The thermal ALE process may include iteratively performing pretreatment, atomistic adsorption (or condensation), RTP (or thermal removal), and surface refresh (or purge) operations. RTP may be used to remove films atomistically and isotropically without thermal budget issues, as compared to traditional continuous wave (CW) heating approaches. In one embodiment, thermal pulse durations are less than 3 ms in duration and increase surface substrate temperatures to approximately 500° C. to avoid thermal budget issues. For example, this type of RTP may be performed when etching silicon (Si) to prevent Si diffusion in germanium (Ge).

During pretreatment (or a first surface modification operation), hydrogen $H_2$, ammonia $NH_3$, and/or other gas may be supplied to while providing a plasma to modify the surface and/or portion of a substrate. During atomistic adsorption (or a second surface modification operation), oxygen, a halogen gas (e.g., chlorine $Cl_2$, iodine $I_2$, fluorine $F_3$, or other halogen gas), nitrogen trifluoride $NF_3$, and/or other reactant is provided and adsorbed into the surface and/or portion of the substrate. The portion of the substrate subject to atomistic adsorption may be formed of, for example, a metal oxide $MO_x$ such as aluminum (Al) oxide $Al_2O_3$, titanium (Ti) oxide $TiO_2$, or zirconium (Zr) oxide or other material such as silicon nitride $SiN_x$, Si, Ge, $SiO_2$, titanium nitride TiN, or hafnium oxide $HfO_2$. Subsequent to atomistic adsorption, the portion being removed may be, for example: an oxide or halide with or without a ligand; $MCl_x(F_x)$; aluminum fluoride $AlF_3$; titanium oxide $TiO_2$; ammonium fluorosilicate $(NH_4)_2SiF_6$; or other modified material.

In an embodiment, a predetermined number of cycles are performed to remove a predetermined amount of one or more layers of a substrate. As an example, a 1 nm thick layer of an uppermost portion of a substrate may be removed per cycle of the thermal ALE process. During the rapid thermal operation, a flash lamp assembly or a laser may be used as shown in FIGS. 1-2. Table 1 provides five examples (one per row) of the thermal ALE process being performed on different types of substrates. The columns indicate: a) substrate materials being removed; b) types of plasma being provided during pretreatment (PT); c) gases being supplied during the atomistic adsorption (AA) operation; d) flash lamp or laser may be performed for the rapid thermal (RT) heating operation; and a purge gas being provided during the surface refresh (SR) operation.

TABLE 1

| Process | PT | AA | RT | SR |
|---|---|---|---|---|
| Ge Removal | $H_2$ Plasma | $O_2$ | Flash Lamp or Laser | Ar |
| Ge over Si Removal | $H_2$ Plasma | $Cl_2$ | Flash Lamp or Laser | Ar |
| Si over Ge Removal | $H_2$ Plasma | $I_2$ | Flash Lamp or Laser | Ar |
| TiN Removal | $H_2$ Plasma | $Cl_2$ | Flash Lamp or Laser | Ar |
| $SiO_2$ Removal | $NH_3$, $H_2$ Plasma | $NF_3$, $F_3$ | Flash Lamp or Laser | Ar |

The thermal ALE processes disclosed herein may be performed on other types of substrates. The thermal ALE processes may be performed to remove target films including, for example, germanium Ge, a metal nitride (e.g., TiN), a compound including Si—SiGe, and/or a metal oxide (e.g., $Al_2O_3$ or $HfO_2$). The corresponding by-products that may be removed include germanium oxide GeO, titanium oxychloride TiOCl, titanium oxyfluoride TiOF, silicon chlorine Si—Cl, silicon fluorine Si—F, germanium chlorine Ge—Cl, germanium fluorine Ge—F, aluminum acetylacetonate $Al(acac)_4$, and hafnium acetylacetonate $Hf(acac)_4$.

The substrates may cool down during the surface refresh operations. In one embodiment, active cooling is provided to cryogenically cool the substrates. This shortens the amount of time to cool down the substrates and allows for more cycles to be performed in shortened period of time. Active cooling provides quick recovery without negatively affecting the base (or bulk) portion of the substrates.

Figure 7:
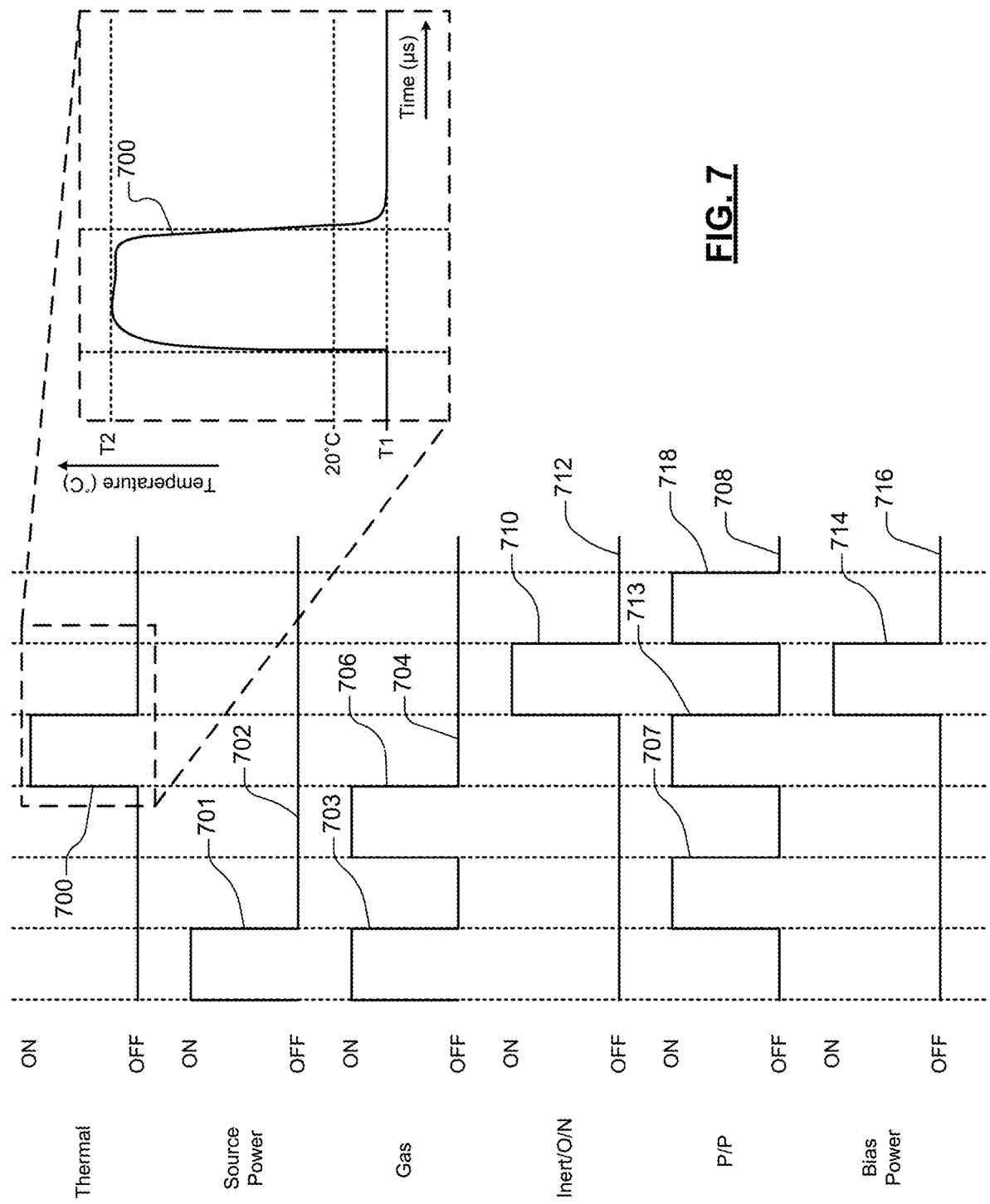
FIG. 7 is an example signal diagram illustrating temperature change over time for a single rapid thermal pulse provided in accordance with the present disclosure.

FIG. 7 shows an example signal diagram illustrating a temperature change pattern over time for a provided single rapid thermal pulse 700. A pulsed thermal source may be used to control surface reactions of a substrate over a predetermined number of milliseconds during ALE or ALD processes. In one implementation, plasma may be generated by turning on source power (represented by pulse 701 of curve 702) and supplying gas (represented by pulse 703 of curve 704) to a processing chamber. The circuits of the substrate may be cleaned by turning on a pump (e.g., the pump 124 of FIG. 1) and performing a purge operation (represented by pulse 707 of curve 708). Surface modification and atomistic adsorption (or condensation) operations may then be performed represented by pulse 706 followed by the thermal heating represented by pulse 700. The processing chamber may then be purged as represented by pulse 710 of curve 712 and pulse 713 of curve 708. Optionally, bias power may be provided as represented by pulse 714 of curve 716. The pump may then be activated to perform a purge as represented by pulse 718.

Figure 8:
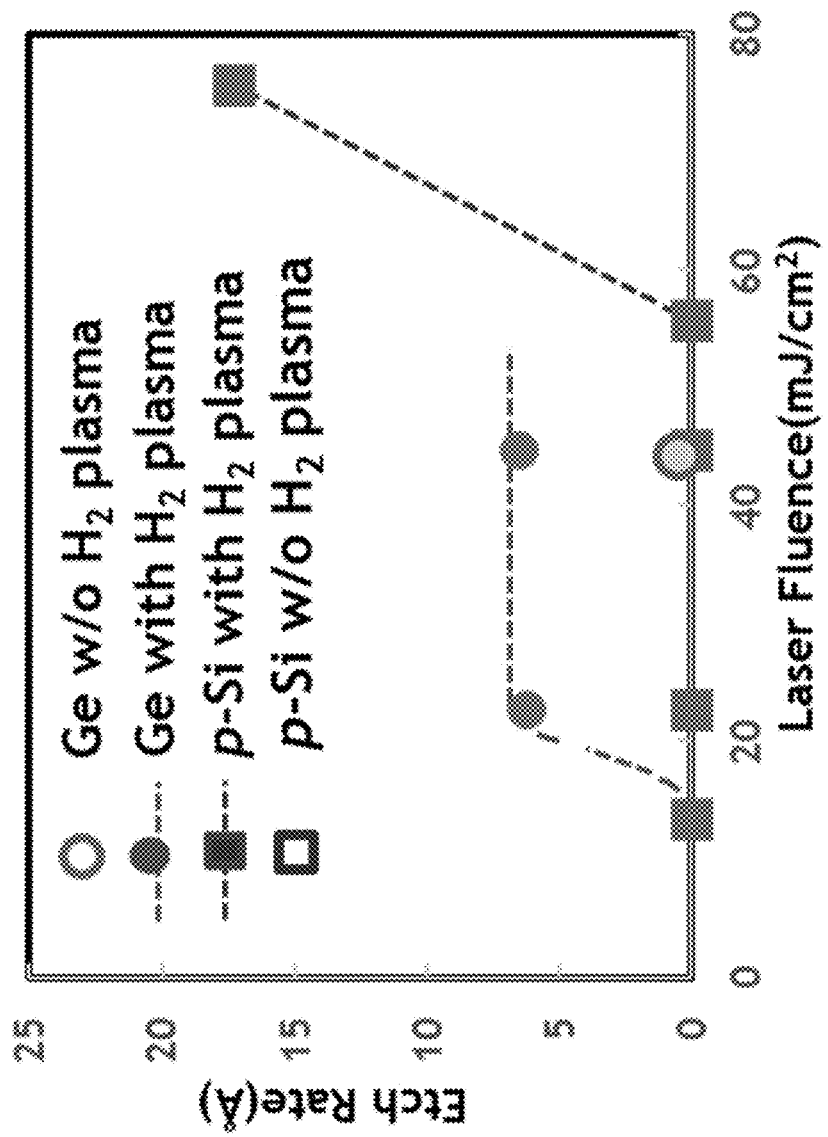
FIG. 8 is an example etch rate versus laser fluence plot for ALE performed in accordance with the present disclosure.

FIG. 8 shows an example etch rate versus laser fluence plot for ALE performed, illustrating differences for Ge without $H_2$ plasma surface modification, Ge with $H_2$ plasma surface modification, p-type Si with $H_2$ plasma surface modification, and p-type Si without $H_2$ plasma surface modification.

Selective removal of portions of Si or Ge layers of a substrate having both Si and Ge layers can be challenging for nano-wire fabrication processes due to similarities of byproducts formed from etching of Si and Ge layers during plasma processing. An example implementation disclosed herein allows for selective removal of Si or Ge layers of a substrate having both Si and Ge layers. The example implementation includes RTP to heat a surface temperature of a substrate during a certain process window of time. $H_2$ plasma treatment for surface modification is performed and reaction time is controlled to selectively etch a Si layer or a Ge layer. This process prevents thermal budget issues unlike a conventionally heated substrate support, which can experience the thermal budget issue of inter-diffusion.

Figure 9:
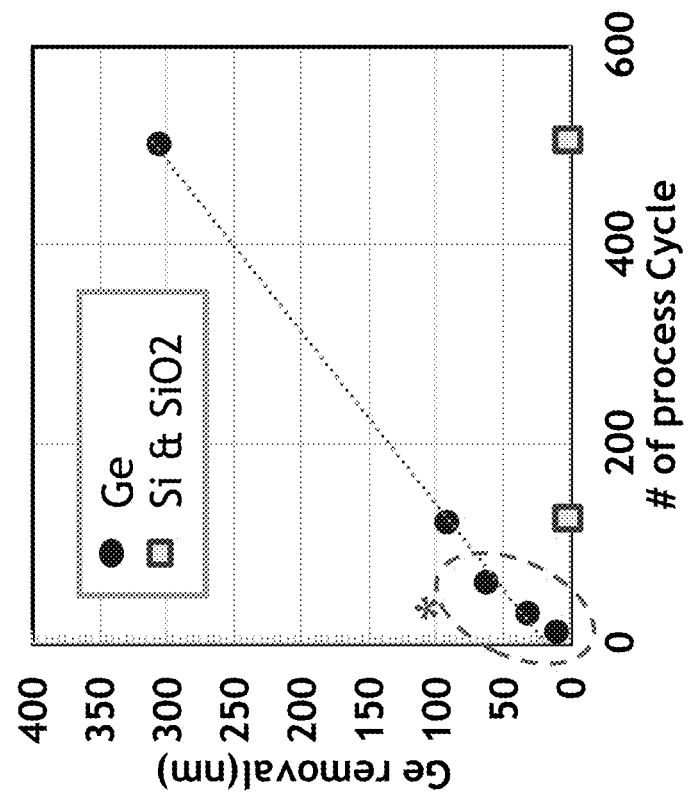
FIG. 9 is an example plot of amounts of germanium removed versus numbers of process cycles for ALE performed in accordance with the present disclosure.
Figure 10:
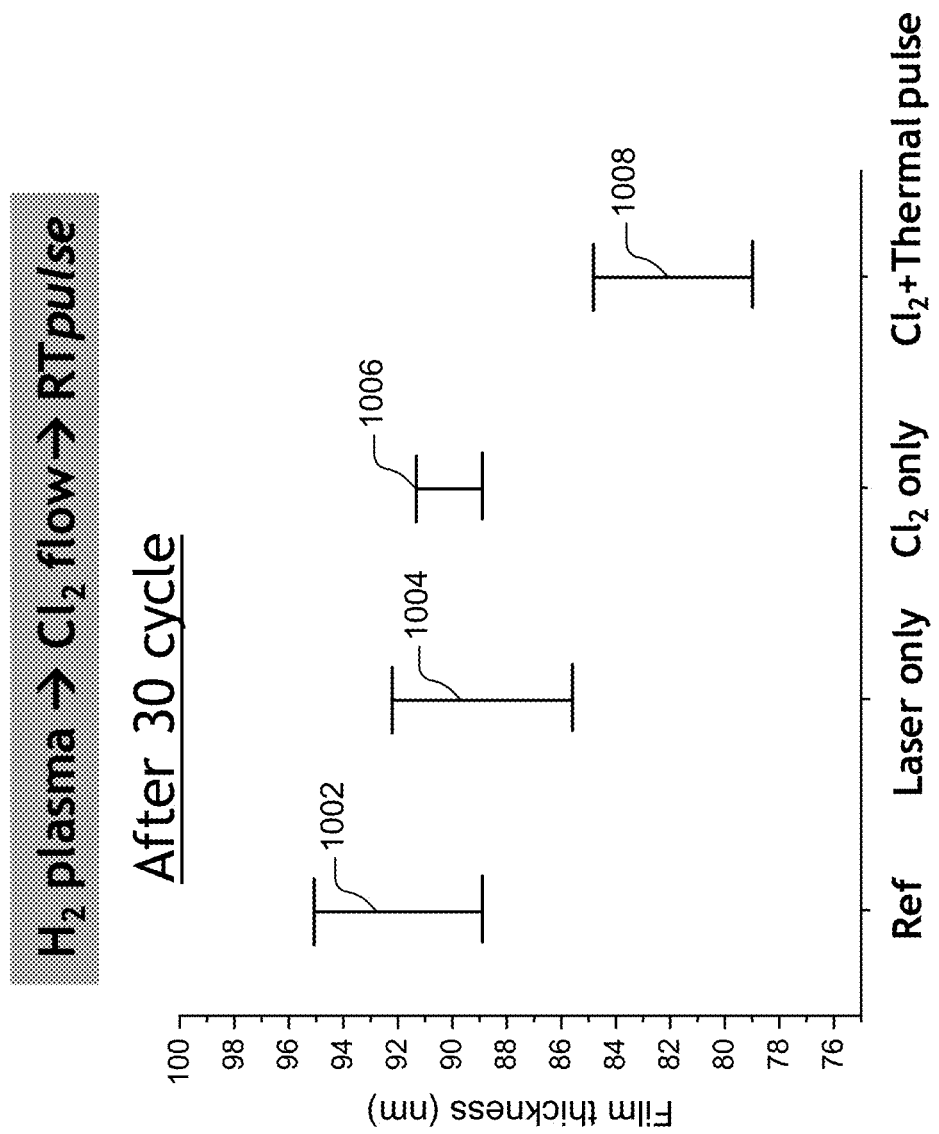
FIG. 10 is an example plot of film thicknesses illustrating different amounts of material removal for reference, pulsed laser heating without chlorine adsorption, chlorine adsorption without pulsed laser heating, and a combination of chlorine adsorption and pulsed laser heating implementations.

The following FIGS. 9-10 illustrate differences between using $O_2$ and $Cl_2$ for atomistic adsorption during a thermal ALE of Ge and TiN. Ge and TiN removal rates are increased linearly as the number of process cycles are increased. Selectivity is controlled by chemistry of pretreatment and thermal energy provided. FIG. 9 shows a plot of an amount of Ge removed versus number of process cycles for ALE performed. The Ge is removed at ambient (or room) temperature. FIG. 10 shows film thicknesses illustrating different amounts of TiN material removal for: a reference; laser RTP (laser pulsed heating) without pretreatment and chlorine adsorption; pretreatment and chlorine adsorption without laser RTP; and a combination of pretreatment, chlorine adsorption and laser RTP. The reference implementation refers to when laser pulsed heating and chlorine adsorption are not performed. Film thickness ranges 1002, 1004, 1006, 1008 are shown providing example ranges for the thickness of the reference, the laser heating without pretreatment and chlorine adsorption, the pretreatment and chlorine adsorption without laser RTP, and the combination of the pretreatment, chlorine adsorption and laser RTP implementations. Chlorine adsorption with laser RTP removes material at a rate, for example, 10 times faster than without chlorine adsorption and laser RTP.

Figure 11:
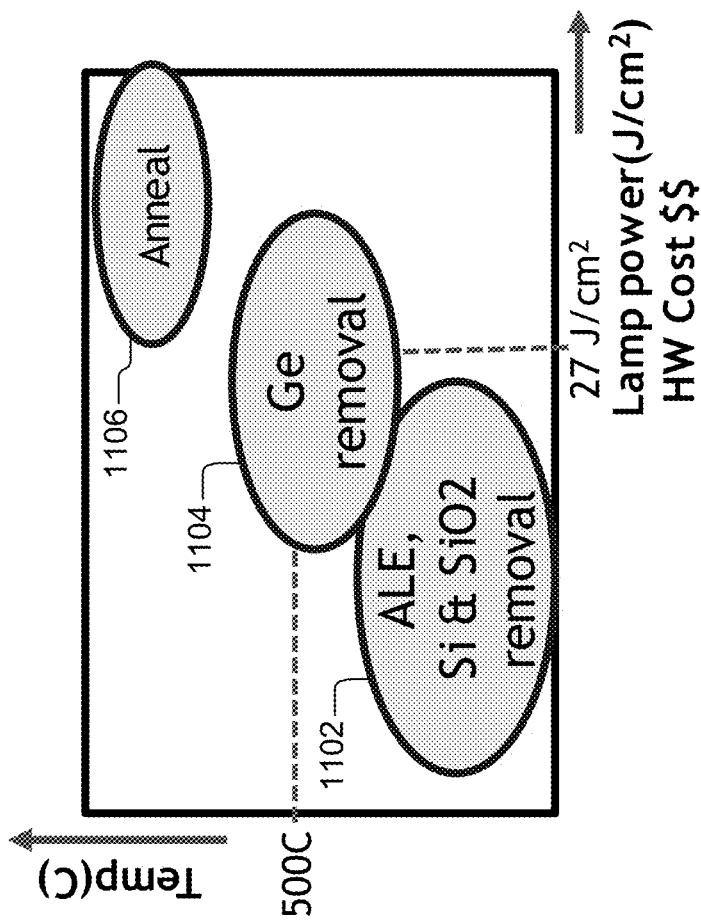
FIG. 11 is an example plot of estimated temperature ranges and lamp power ranges for certain processes.

FIG. 11 shows estimated temperature ranges and lamp power ranges for certain processes. The processes include: an ALE process for removal of Si or $SiO_2$, as represented by range 1102; a Ge removal process, as represented by 1104; and an annealing process including RTP, as represented by 1106. Ge removal is shown as being performed at about 500° C. and with a lamp power per unit area of 27 $J/cm^2$.

Figure 12:
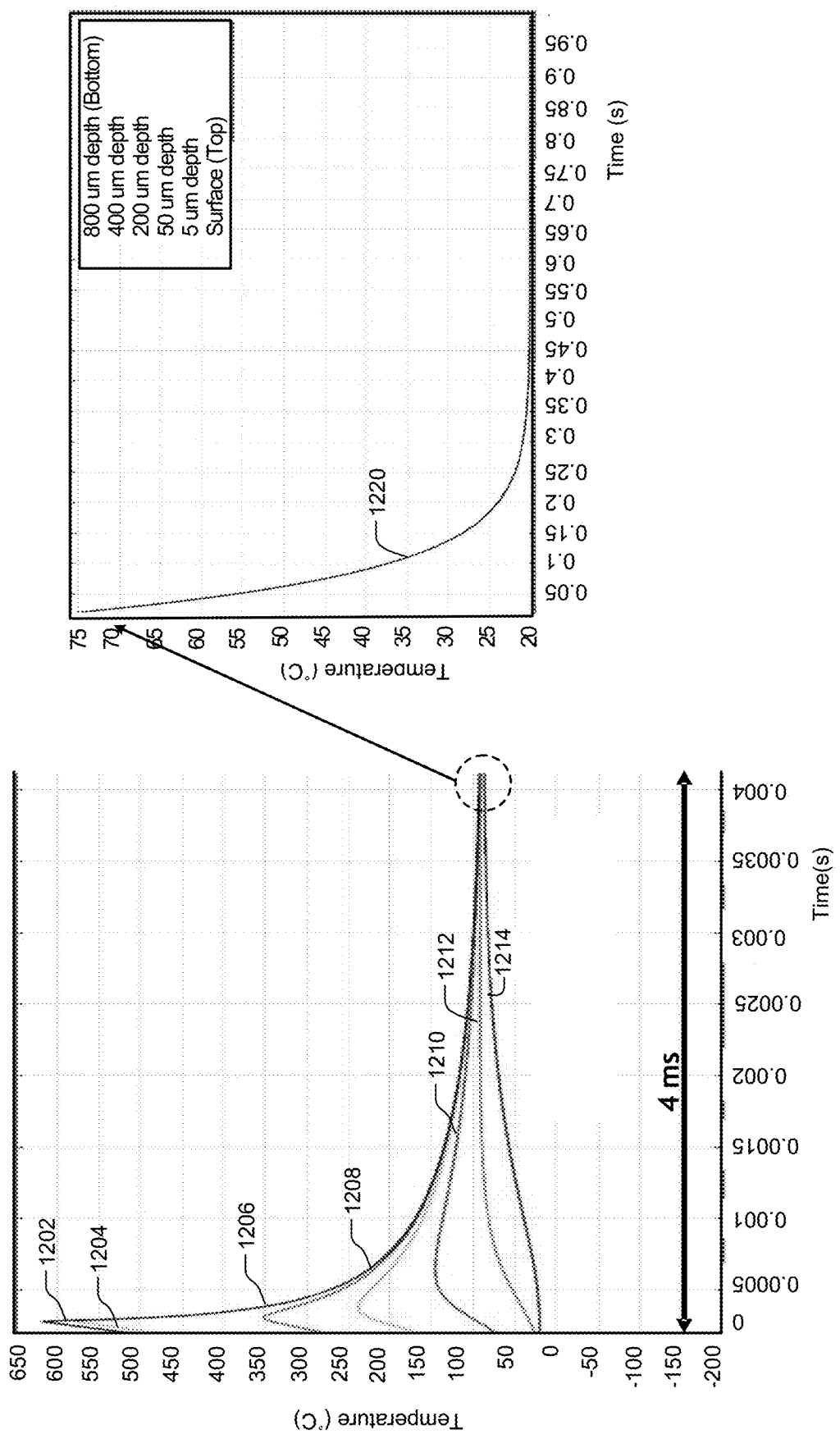
FIG. 12 is an example plot illustrating rates of surface temperature changes during a flash lamp cycle performed in accordance with the present disclose and a corresponding example plot of rates of surface temperature changes during a corresponding cool down period subsequent to the flash lamp cycle.

FIG. 12 shows rates of surface temperature changes during a flash lamp cycle performed in accordance with the present disclose and a corresponding example plot of rates of surface temperature changes during a corresponding cool down period subsequent to the flash lamp cycle. Rapid thermal pulse duration of less than 0.3 ms may be provided with heating for 600° C. of surface temperature. Curves 1202, 1204, 1206, 1208, 1210, 1212, 1214 illustrate temperature changes for depths respectively of surface (i.e. less than 1 μm), 5 μm, 50 μm, 100 μm, 200 μm, 400 μm and 800 μm. The curves 1202, 1204, 1206, 1208, 1210, 1212, 1214 are shown for a 4 ms period. Curve 1220 is shown to illustrate an amount of time to cool down the surface of the substrate to ambient (or room) temperature without active cooling after the 4 ms period. As shown, the cool down time may be 0.5 s. Multiple cycles may be performed as illustrated by the stated curves without increasing temperatures of a base (or bulk) portion of the substrate. Shorter pulse times and/or active cooling can further decrease recovery times and yet further prevent thermal budget issues from occurring.

Figure 13:
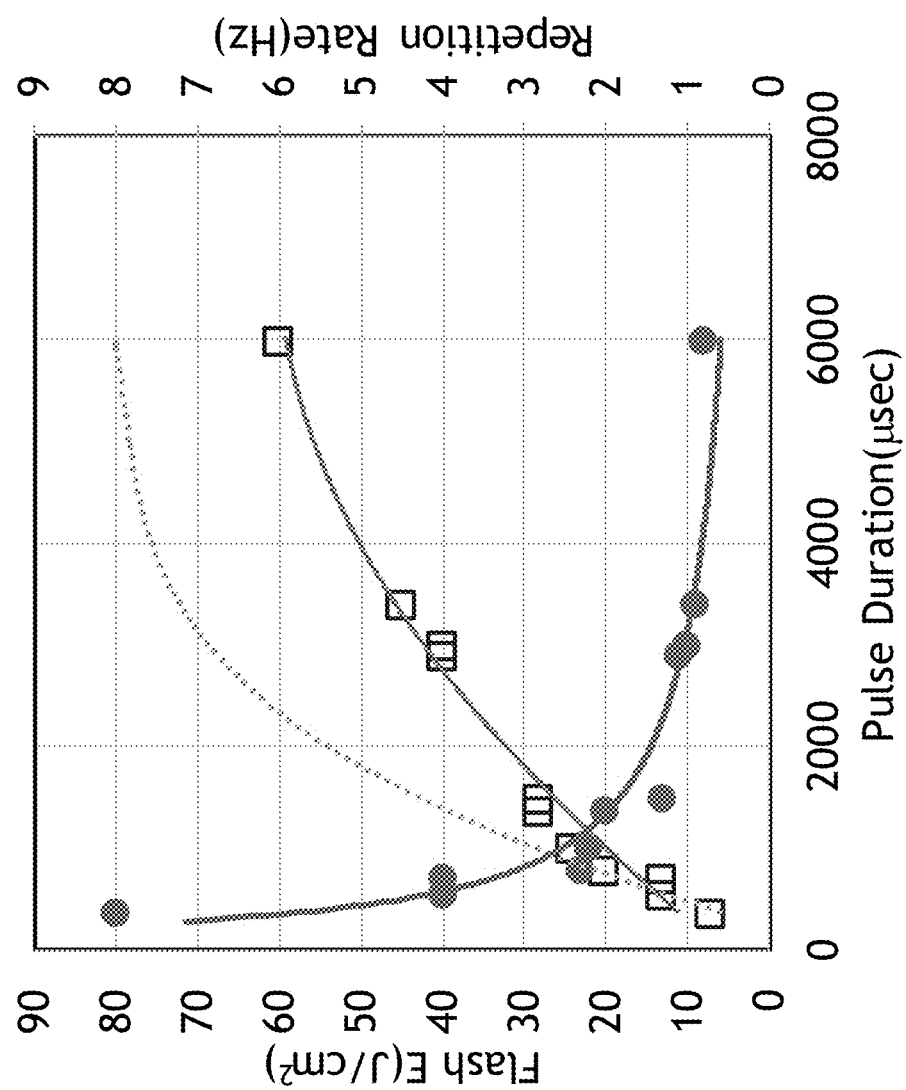
FIG. 13 is an example plot of flash lap power levels and repetition rates versus pulse durations for flash lamp cycles in accordance with the present disclosure.

FIG. 13 shows flash lamp power levels and repetition rates versus pulse durations for flash lamp cycles. The flash lamp power levels and repetition rates are provided for certain rapid thermal pulse durations. The repetition rates refer to a number of pulses per second (e.g., 2 pulses per second is 2 Hertz). A maximum flash lamp power may be 80 $J/cm^2$ and a maximum pulse duration may be 6000 μs. As an example, a rapid thermal process may include less than 30 $J/cm^2$ with less than a 3 ms duration. As another example, 20 $J/cm^2$ may be provided to increase surface temperature of a substrate 400-500° C.

Figure 14:
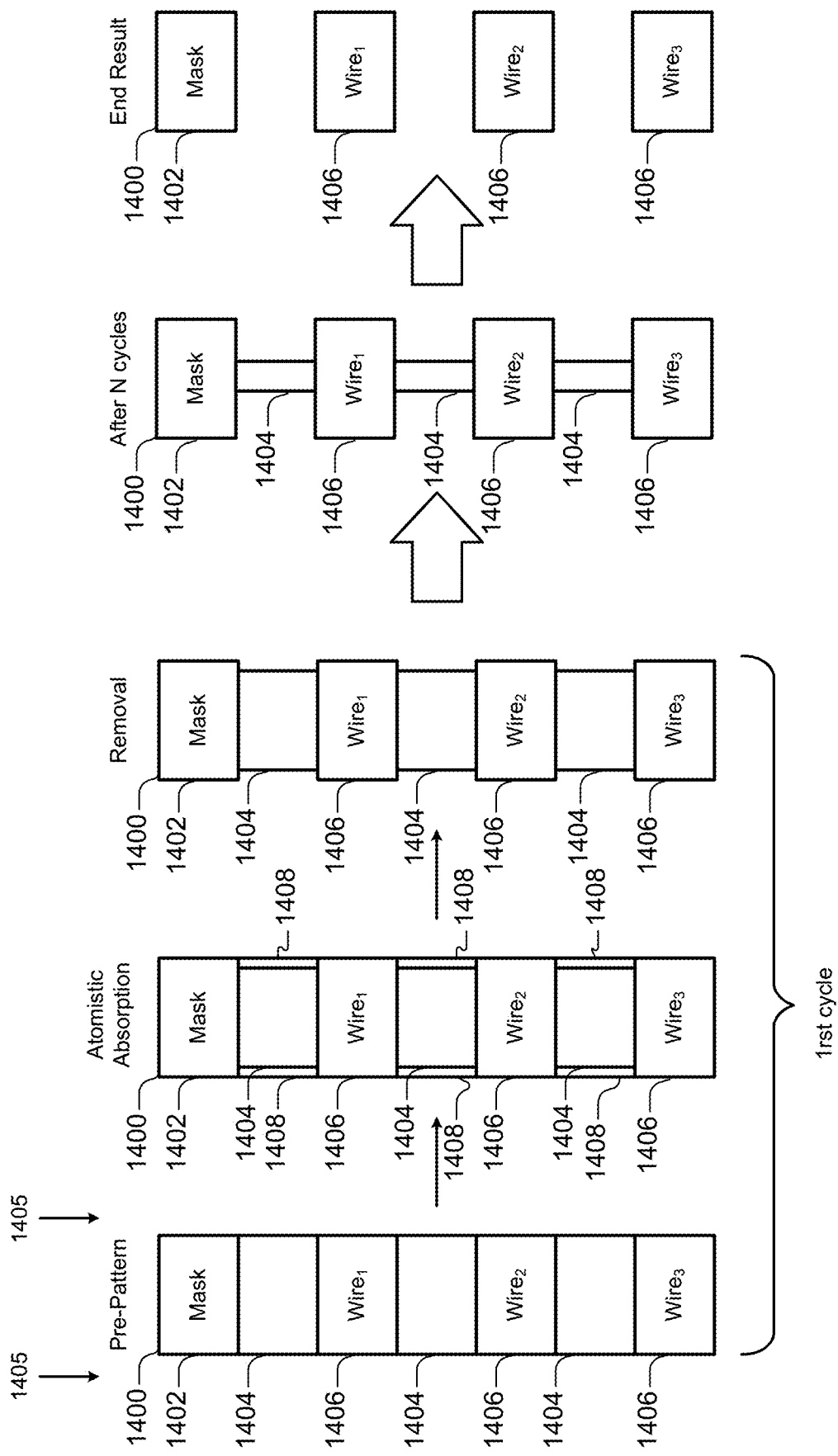
FIG. 14 is a diagram illustrating iteratively performed rapid thermal pulse cycles for removal of portions of dielectric layers in accordance with the present disclosure.

FIG. 14 shows a diagram illustrating iteratively performed rapid thermal pulse cycles for removal of portions of dielectric layers from a portion of a substrate. A stack of layers 1400 is shown from which portions of dielectric layers 1404 are removed during each cycle. The stack of layers 1400 is disposed between two trenches (represented by arrows 1405), which provides etching access to sides of the dielectric layers 1404. The substrate may have been previously etched or cut to provide the trenches. The stack of layers 1400 includes a mask layer 1402, dielectric layers 1404 (e.g., layers formed of Si), and conductive layers 1406 (e.g., conductive elements or wires formed of SiGe). Portions of the dielectric layers 1404 are removed during each cycle of the corresponding RTP process. For example, portions 1408 are removed during a first cycle. The portions 1408 may be respective monolayers of the dielectric layers 1404.

Traditionally, removal of portions of Si or Ge layers was done either by (i) an anisotropic plasma etch process, or (ii) an isotropic digital etch process including an oxidation (or wet) operation and a removal (or wet or dry) operation. The anisotropic plasma etch process can cause layer damage and the isotropic digital etch process (or wet process) can result in layer pattern collapse in, for example, a center area of multiple layers due to tension from use of a wet chemical. A dry process may be performed instead of a wet process, however a dry process has corresponding risks of layer damage. These concerns are prevalent in nano-scale (or nano-wire) applications. For example, a stack of Si nano-wires extending over a predetermined distance may be 60 nm thick and be spaced 20 nm apart. When wet etching is performed, a center area between ends of the Si nano-wires may collapse, such that the gaps between the Si nano-wires are decreased to an extent that the Si nano-wires are in contact with each other.

The disclosed examples provide isotropic ALE with RTP to remove portions of layers without layer damage and/or pattern collapse. In one embodiment, multiple cycles of oxidation and removal of portions of, for example, Si layers using RTP is performed to provide gate-all-around (GAA) field effect transistors (FETs), which are formed from an original stack of layers. This process is a dry process and enables damage free high aspect ratio (HAR) atomistic etch rate control.

Figure 15:
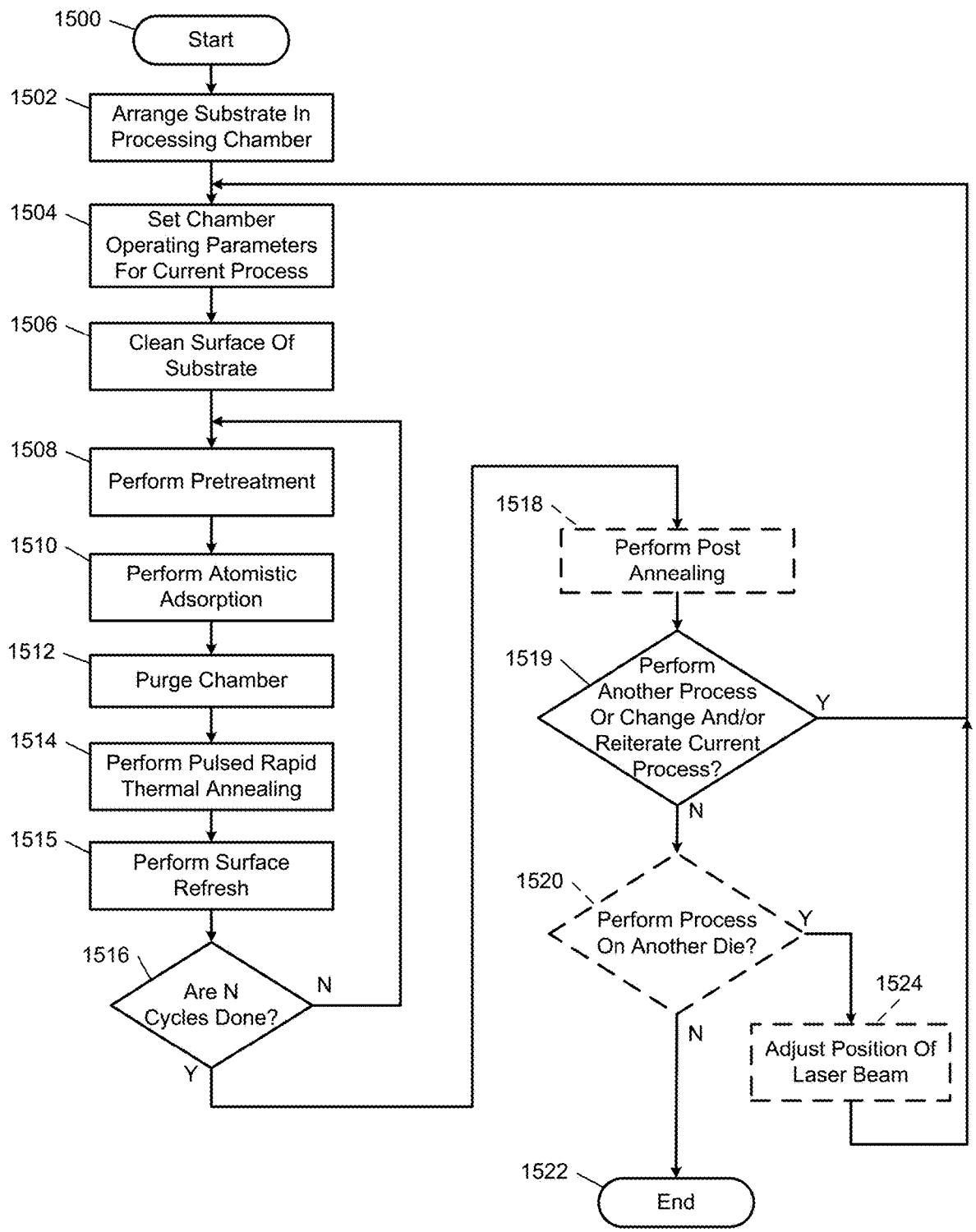
FIG. 15 illustrates an ALE method in accordance with the present disclosure.

The systems disclosed herein may be operated using numerous methods, an example method is illustrated in FIG. 15. FIG. 15 shows an ALE method implementing RTP as described herein. Although the following operations are primarily described with respect to the implementations of FIGS. 1 and 2, the operations may be easily modified to apply to other implementations of the present disclosure. The operations may be iteratively performed.

The method may begin at 1500. At 1502, a substrate (e.g., the substrate 112 of FIGS. 1 and 2 and/or a 300 mm diameter substrate) is arranged in a processing chamber. At 1504, chamber operating parameters such as substrate support temperatures, chamber pressures, RF power and bias power levels, and gas flow rates are set.

At 1506, a surface of the substrate is cleaned. As an example the substrate may include a Ge layer disposed on a Si layer. The top surface of the Ge lay may be cleaned.

At 1508, pretreatment may be performed including exposing the surface of the substrate with, for example $H_2$ plasma or $NH_3$ plasma, for de-chlorination and surface activation. As an example, a plasma gas mixture including hydrogen $H_2$ gas or ammonia $NH_3$ gas species is supplied to the processing chamber. In one embodiment, surface modification is performed without plasma, but by using gases having a preselected chemistry.

At 1510, atomistic adsorption is performed. This may occur at low temperatures (e.g., less than or equal to 20° C.) and include exposing the surface of the substrate to $O_2$, $Cl_2$, $I_2$, $NF_3$ or other reactant. In one embodiment, atomistic adsorption is performed at less than a room (or ambient) temperature. As an example, a non-plasma flow of $Cl_2$ may be provided. At 1512, the corresponding process chamber is purged of gases.

At 1514, pulsed rapid thermal annealing is performed using, for example, flash lamps, a laser or other suitable lamps (e.g., infrared lamps) capable of being rapidly pulsed as described herein. At least operations 1508-1515 may be iteratively performed including modulating surface (or upper portion) temperatures of the substrate. The temperature of the surface (or upper portion) may be modulated multiple times in a single second. Pulsed rapid thermal annealing is performed at 1514 for desorption/removal purposes. This may include generating one or more thermal energy pulses to heat the modified portion of the substrate. Temperatures may be increased to evaporate certain molecules.

A base and/or bulk of the substrate is maintained at or below a predetermined temperature (e.g., less than or equal to 20° C.) during operation 1514. $GeCl_2$ starts to sublime above 260° C. $SiCl_2$ starts to sublime above 650° C. In an application where a layer of Ge is disposed over a layer of Si, by applying a proper laser pulse or flash lamp pulse of energy, Ge can be selectively etched without etching Si with infinite selectivity. RTP enables one processing chamber configuration to be used with high throughput.

Figure 16:
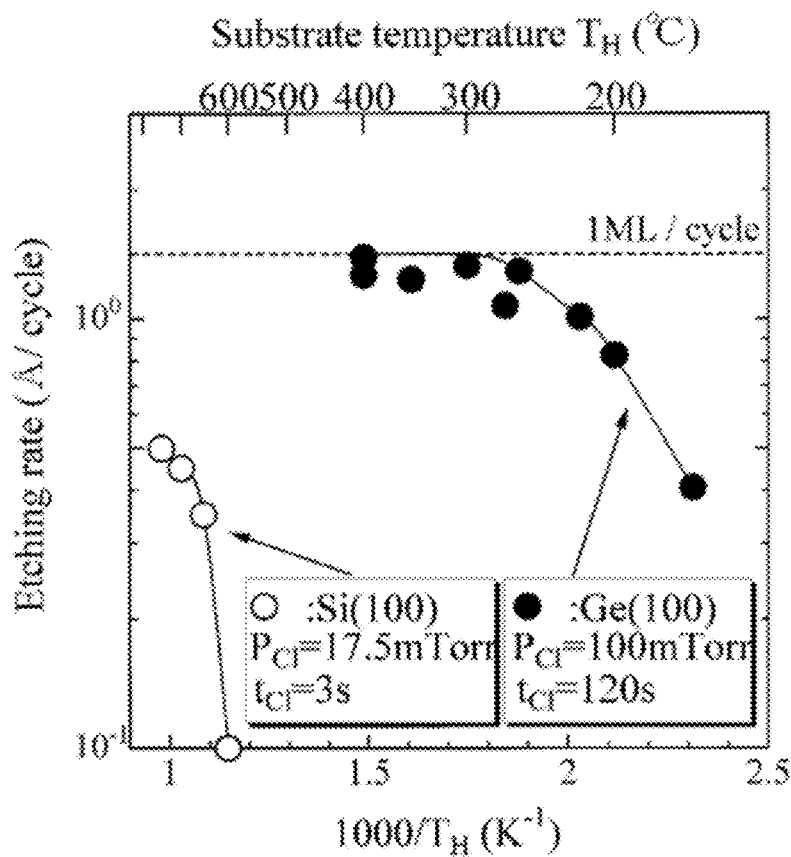
FIG. 16 is an example plot of etching rates versus substrate surface temperatures during an ALE process performed in accordance with the present disclosure.

Multiple processing operations may be performed in the single processing chamber. FIG. 16 shows a plot of etching rates for Ge and Si versus substrate surface temperatures during an ALE process performed as described. As another example, the pulses may be 0.1 ms in length and increase surface and/or a portion of the substrate up to 1000° C.

In some examples, each of the flash lamp pulses provides 10 $J/cm^2$ (i.e., energy per unit area of the substrate) to 80 $J/cm^2$. In some examples, each of the laser pulses provides 10 $mJ/cm^2$ to 80 $mJ/cm^2$. In some examples, the annealing is performed during a predetermined period in a range from 0.1 ms to 20 ms. In one embodiment, the flash lamp is used with pulse durations of 1 ms or the laser is used with pulse durations of 1 µs to heat the surface or upper portion of the substrate from an initial temperature to greater than 500° C. and then cooled down back to the initial temperature in less than 1 s.

Figure 17:
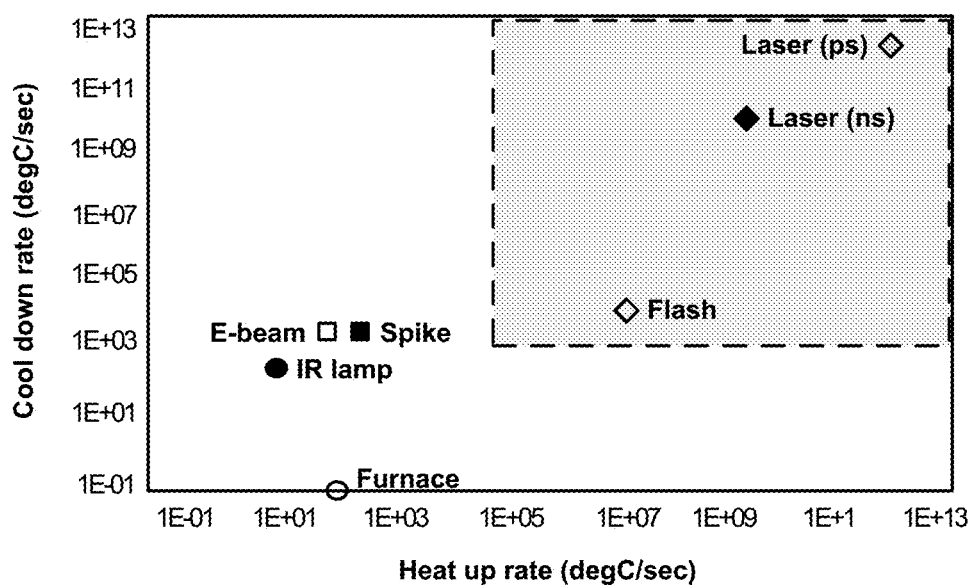
FIG. 17 is a plot illustrating example cool down rates versus heat up rates for different heat sources.

Operations 1508, 1510, 1514 allow for controllable atom by atom removal of an upper layer of the substrate that was modified during operations 1508 and 1510. The rapid heating performed at 1514 provides an isotropic reaction without use of plasma. In addition, the claimed heating allows for rapid cool down, which also prevents thermal budget issues. FIG. 17 shows example cool down rates versus heat up rates for different heating sources and corresponding methods. FIG. 17 shows that the disclosed flash lamp and laser heating methods provide quicker heat up rates and cool down rates, as compared to other furnace, IR lamp, Electron (E)-beam, and spike methods.

At 1515, the surface of the substrate may be refreshed by purging the process chamber with a purge gas (e.g., argon Ar gas) to perform ion bombardment and remove the modified portion(s) of the substrate. In one embodiment, the processing chamber is purged between one or more consecutive pairs of provided rapid thermal pulses. In an embodiment, the gases are purged from the processing chamber between each consecutive pair of pulses. This enables performance of multiple plasma and/or gas phase processes within the processing chamber. In an embodiment, substrate support cooling is provided during and/or subsequent to pulsed rapid thermal annealing to aid in maintaining temperatures of the base and/or bulk of the substrate during pulsed rapid thermal annealing and to aid in rapid cooling of the substrate subsequent to performing pulsed rapid thermal annealing.

At 1516, the controller 180 or 208 and/or rapid thermal pulse controller 182 or 210 determines whether N cycles have been completed. If N cycles have been completed, operation 1518 is performed, otherwise operation 1508 is performed. At 1518, the controller 180 or 210 may optionally perform a second (or post) annealing operation. At 1519, the controller 180 or 210 may determine, for a current die, whether to perform another process and/or whether to change and/or reiterate a current process. If another process is to be performed, operation 1504 may be performed, otherwise operation 1520 may be performed if a laser and a lens circuit is utilized as in the embodiment of FIG. 2. If flash lamps are used as in the embodiment of FIG. 1, the method may end at 1522 if another process or a change in a current process is not performed. If a process is to be performed on another die, operation 1524 is performed, otherwise the method may end at 1522.

At 1524, the controller 208 moves the mirrors 214, 216 to change an image plane position of a laser beam to be over a different die of the substrate 112. As an example, a 2 cm×2 cm laser beam may be moved from being over a first die to being over a second die. The described method may be iteratively performed to scan the laser beam over tens to hundreds of dies on the substrate. Movement of the mirrors 214, 216 may be synchronized with a pulsing repetition rate of the laser 204 to provide one or more shots per die.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

Although the method of FIG. 15 is described for performing ALE using the systems of FIGS. 1-2, the systems of FIGS. 1-2 may be used to perform ALD. The heat sources, such as the flash lamps and the laser, may be used to grow monolayers on substrates. For example, RTP may be provided prior to and/or during deposition operations and material may be deposited (or grown) rather than removed. Different gases may be provided and maintained in a corresponding processing chamber during ALD to allow for growth of the monolayers.

Figure 18:
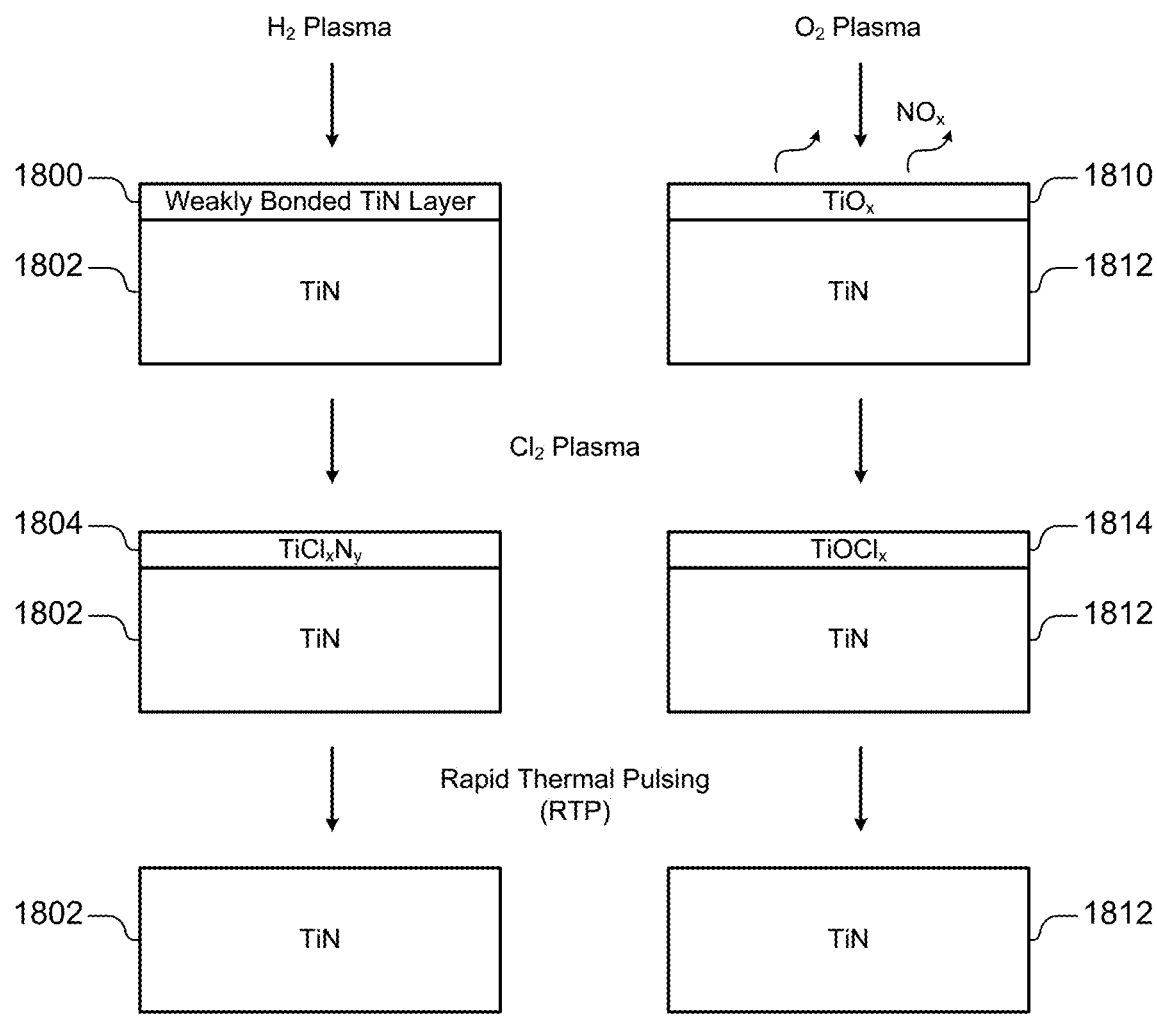
FIG. 18 is a block diagram illustrating two example ALE methods of removing layers of titanium nitride in accordance with the present disclosure.

FIG. 18 is a block diagram illustrating two example ALE methods of removing monolayers of TiN. The methods of FIG. 18 may be performed using the systems of FIGS. 1-2. The first method includes providing $H_2$ plasma as a pretreatment operation to alter an upper portion of a TiN layer or substrate and provide a weakly bonded TiN layer 1800 on a remainder 1802 of the TiN layer or substrate. $Cl_2$ plasma is then provided to perform atomistic adsorption to convert the weakly bonded TiN layer 1800 to a $TiCl_xN_y$ layer 1804. $TiCl_xN_y$ is a volatile complex compound. RTP is then performed to remove the $TiCl_xN_y$ layer 1804.

As an example, a cycle may include: providing $H_2$ plasma for 13 s including providing $H_2$ gas and Ar gas each at a flow rate of 90 standard cubic centimeters (sccm) and at a pressure of 180 milli-Torr (mT); providing $Cl_2$ plasma for 25 s including providing $Cl_2$ at a flow rate of 100 sccm and at a pressure of 400 mT; performing a purge operation for 30 s subsequent to the atomistic adsorption operation and prior to the RTP operation; and performing the RTP operation including providing 5 pulses, each of which at x $mJ/cm^2$. In an embodiment, x is 21. In one embodiment, this cycle is performed a predetermined number of times (e.g., 30 times). Table 2 below shows for this method: an example film thickness prior to performing atomistic adsorption with $Cl_2$ and/or performing RTP; and example film thicknesses resulting from performing atomistic adsorption with $Cl_2$ and/or RTP.

TABLE 2

| Process | Before (nm) | After (nm) | ER (Å/cycle) |
| --- | --- | --- | --- |
| Laser RTP Only | 92.8 | 89.4 | 1.1 |
| $Cl_2$ only | 92.8 | 89.9 | 1.0 |
| $Cl_2$ and laser RTP | 92.8 | 81.2 | 3.9 |

Figure 19:
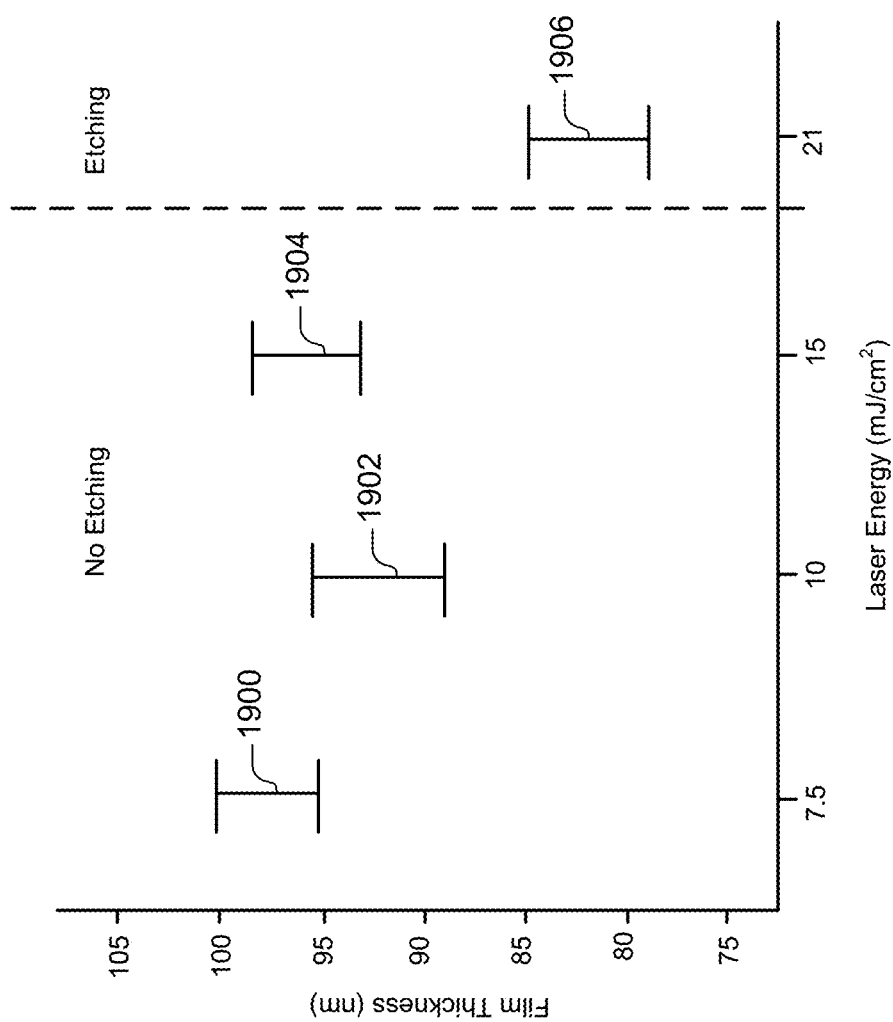
FIG. 19 is an example plot of titanium nitride film thicknesses for different energy levels.

FIG. 19 shows an example plot of TiN film thicknesses for different energy levels. Etching occurs at laser energy of greater than or equal to 20 $mJ/cm^2$. Thus, etching occurs at a power level of 21 mJ/cm2 and range 1906 is below ranges 1900, 1902, 1904.

Figure 20:
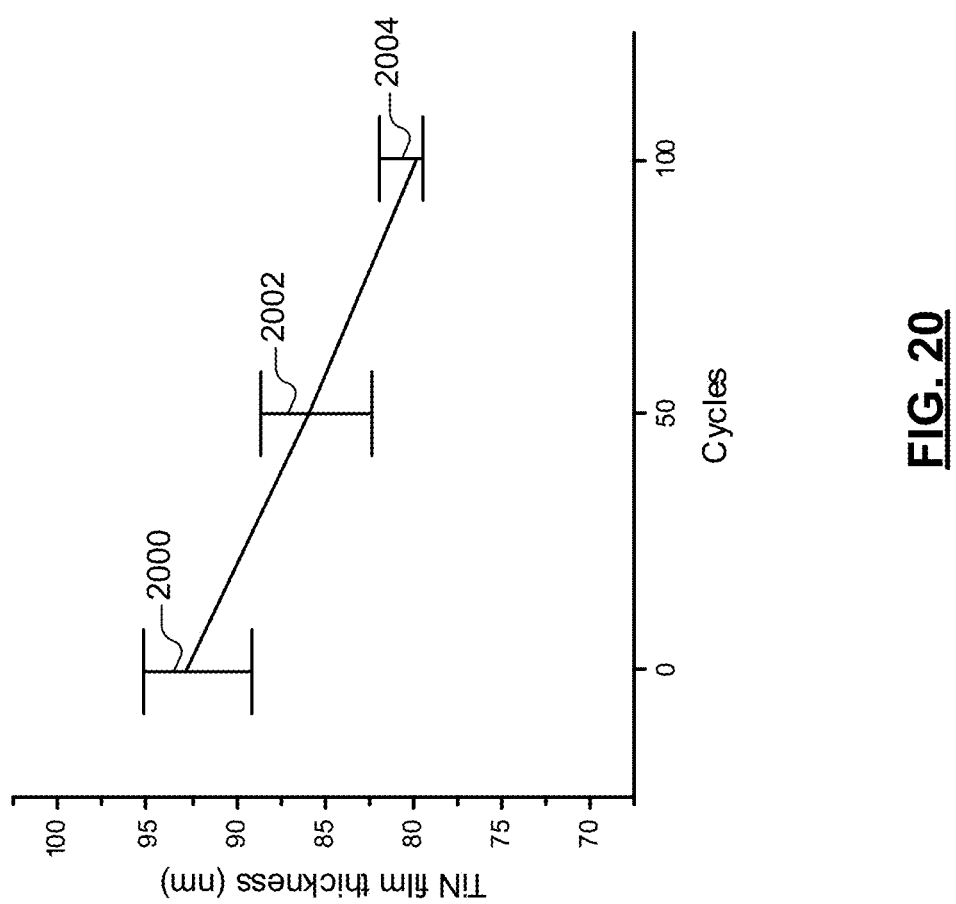
FIG. 20 is an example plot of titanium nitride film thicknesses versus different numbers of ALE cycles performed in accordance with the present disclosure.

Referring again to FIG. 18, the second method includes providing $O_2$ plasma as a pretreatment operation to alter an upper portion of a TiN layer or substrate by removing nitrogen as nitrogen oxide (NOx) to provide a $TiO_x$ layer 1810 on a remainder 1812 of the TiN layer or substrate. $Cl_2$ plasma is then provided to perform atomistic adsorption to convert the $TiO_x$ layer 1810 to a titanium sub-oxychloride ($TiOCl_x$) layer 1814. $TiOCl_x$ is a volatile complex compound. RTP is then performed to remove the $TiOCl_x$ layer 1814. As an example, a cycle may include: providing $O_2$ plasma for 5 s including providing $O_2$ gas and Ar gas each at a flow rate of 90 standard cubic centimeters (sccm) and at a pressure of 180 milli-Torr (mT); providing $Cl_2$ plasma for 25 s including providing $Cl_2$ at a flow rate of 100 sccm and at a pressure of 400 mT; performing a purge operation for 30 s subsequent to the atomistic adsorption operation and prior to the RTP operation; and performing the RTP operation including providing 5 pulses, each of which at x $mJ/cm^2$. As an example, for the second method, an example film thickness prior to performing the second method is 93 nm and after performing 100 cycles of the second method is 79.6 nm. The corresponding etch rate may be 1.32 Å per cycle. FIG. 20 shows an example plot of TiN film thicknesses versus different numbers of ALE cycles performed. Ranges 2000, 2002, 2004 are shown as examples for 0, 50, and 100 cycles performed.

The two stated methods are isotropic ALE processes. In one embodiment, these methods provide etch rates of 1.5-2.0 Å per cycle. A 2.0 Å per cycle etch rate is 10 times faster than an oxidation-fluorination etch process of TiN. The etch depth may be controlled by controlling the number of cycles of the stated methods that are performed and/or the plasma power levels. The two methods as above-described include light irradiation/pulsed thermal sources enabling isotropic removal during ALE processes. The methods may be modified to perform two anisotropic ALE processes by applying plasma during RTP and introducing a bias voltage via one or more electrodes in a substrate support. For example, a bias voltage may be provided via the electrode 118 of the substrate support 110 of FIG. 1. In addition, bias power to one or more electrodes in the substrate support may be controlled to control ion directionality to enable control of isotropy.

Figure 21:
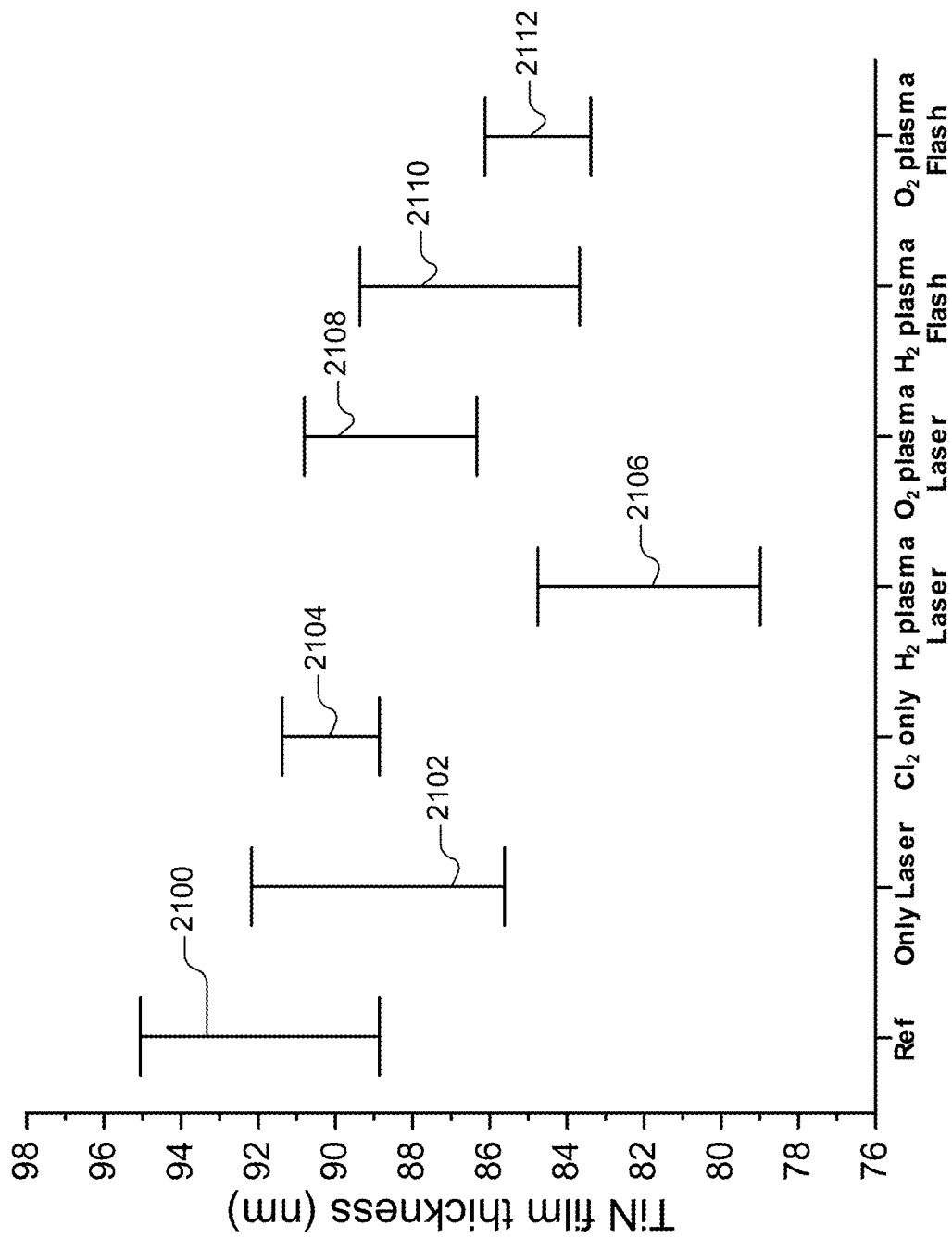
FIG. 21 is an example plot of titanium nitride film thicknesses illustrating different amounts of material removal for different operations performed.

FIG. 21 is an example plot of TiN film thickness ranges illustrating different amounts of material removal for different operations performed. TiN film thickness ranges 2100, 2102, 2104, 2106, 2108, 2110, 2112 are shown respectively for: a reference; laser RTP without pretreatment and atomistic adsorption (or "only laser"); atomistic adsorption with $Cl_2$ without pretreatment and laser RTP; $H_2$ plasma pretreatment and laser RTP; $O_2$ plasma pretreatment and laser RTP; $H_2$ plasma pretreatment with flash lamp RTP; and $O_2$ plasma pretreatment with flash lamp RTP. As an example and for 30 cycles, etch rates of TiN for $H_2$ plasma pretreatment and laser RTP, $O_2$ plasma pretreatment and laser RTP, $H_2$ plasma pretreatment with flash lamp RTP, and $O_2$ plasma pretreatment with flash lamp RTP may be respectively 3.9 Å per cycle, 1.4 Å per cycle, 2.0 Å per cycle and 2.4 Å per cycle.

Figure 22:
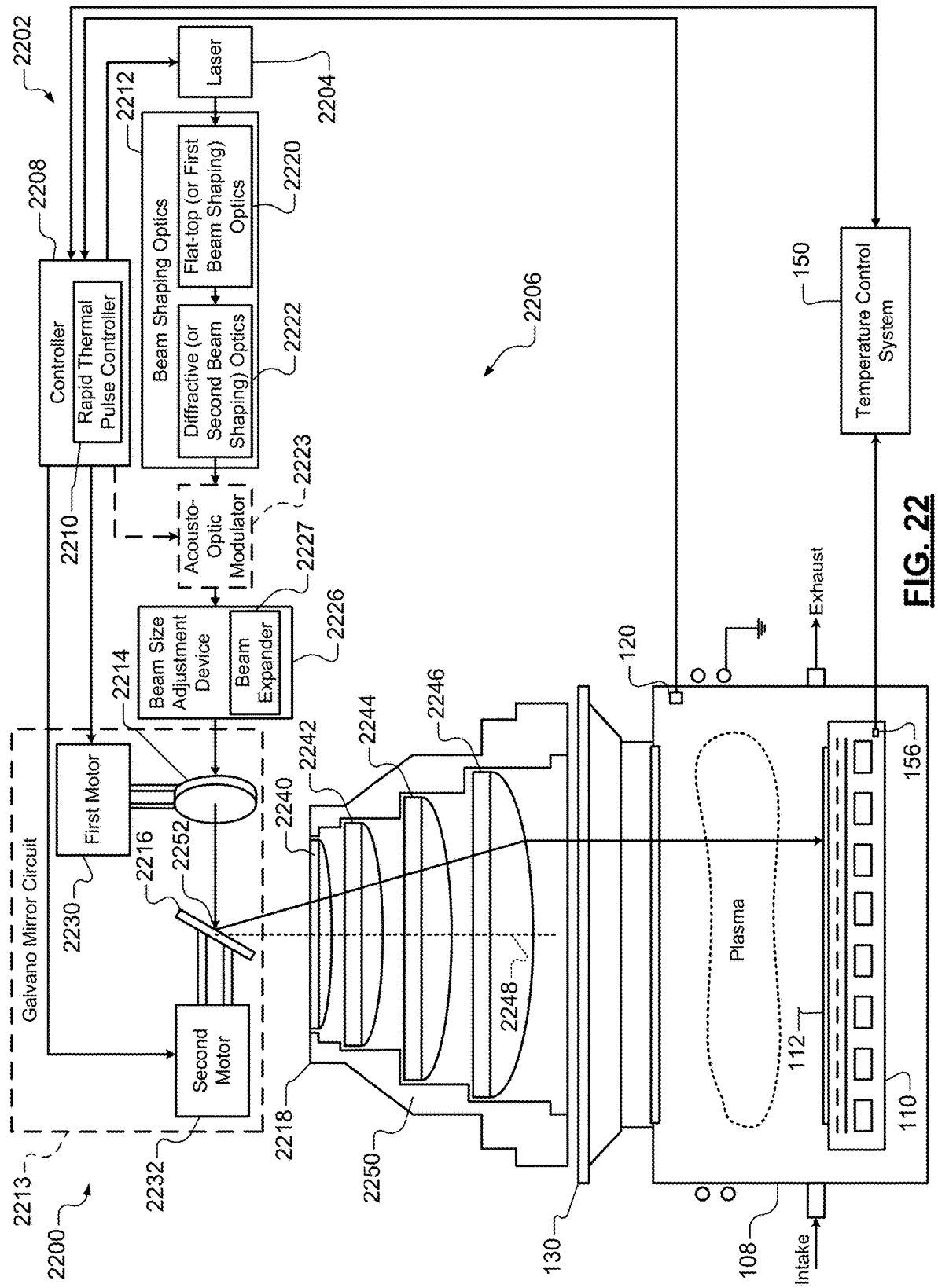
FIG. 22 is functional block diagram of an example of a substrate processing system incorporating an acousto-optic modulator in accordance with an embodiment of the present disclosure.

FIG. 22 shows an example of a substrate processing system 2200 incorporating a RTP system 2202 including a laser 2204, a lens circuit 2206 and a controller 2208 with a RTP controller 2210. The substrate processing system 2200 may operate similar to the substrate processing system 200 of FIG. 2. The laser 2204 is a heat source that may be pulsed (or modulated) by the RTP controller 2210 during RTP operations based on a control signal received from the RTP controller 2210. This may occur during ALE and ALD processes.

The lens circuit 2206 includes beam shaping optics 2212, a Galvano mirror circuit 2213 that includes a first mirror 2214 and a second mirror 2216, and a tele-centric lens assembly 2218. The beam shaping optics 2212 may include flat-top (or first beam shaping) optics 2220 and diffractive (or second beam shaping) optics 2222. The flat-top optics 2220 are used to convert a laser beam received from the laser 2204, where the laser beam has a Gaussian distribution, into a flat-top beam (e.g., a 2 centimeter (cm)×2 cm flat-top beam). A temperature profile of the laser beam is also Gaussian. The diffractive optics 2222 convert the flat-top circular beam out of the flat-top optics 2220 to a square beam. The square beam has a corresponding uniform temperature distribution on a substrate. The substrate 112 may be disposed on a substrate support (e.g., the substrate support 110 of FIG. 1).

The laser 2204 may be operated in a pulse mode or a continuous wave (CW) mode. During the pulse mode, the output of the beam shaping optics 2212 may be provided directly to the beam size adjustment device 2226. During the pulse mode, the RTP controller 2210 controls a pulse rate of the laser beam, such that pulse duration is in a pico-second or a nano-second range. An acousto-optic modulator 2223 may be included when the laser 2204 is being operated in the CW mode and be controlled by the RTP controller 2210. In one embodiment, the RTP controller 2210 generates a radio frequency (RF) control signal, which is provided to the acousto-optic modulator 2223. The RF control signal is provided to control a change in a refractive index of a crystal of the acousto-optic modulator 2223. The refractive index of the crystal changes based on a frequency of the RF control signal. The laser beam provided from the beam shaping optics 2212 to the acousto-optic modulator 2223 is deflected by the crystal based on a frequency of the RF signal. The crystal performs as a laser shutter that permits or prevents passage of the laser beam to the beam size adjustment device 2226 and/or the first mirror 2214. In one embodiment, the RTP controller 2210 controls the frequency of the RF control signal, such that the continuous wave laser beam out of the beam shaping optics 2212 is effectively pulsed (or modulated) by the acousto-optic modulator 2223. The laser beam is pulsed, such that a period of each pulse is in a micro-second or a milli-second range. As a result, use of the acousto-optic modulator 2223 allows for pulsed laser beam generation having longer duration pulses for increased heating per pulse.

The beam size adjustment device 2226 may be disposed between the beam shaping optics 2212 and the first mirror 2214. In an embodiment, the beam size adjustment device 2226 adjusts a size of the square beam to be greater than or equal to a size of a die on the substrate 112. The beam size adjustment device 2226 may be motorized and include a beam expander 2227.

The RTP controller 2210 and the Galvano mirror circuit 2213 may operate as a X-Y galvanometer scanning system. The first mirror 2214 may be used to move the laser beam across a surface of the substrate 112 in a first (or X) direction. The second mirror 2216 may be used to move the laser beam across the surface of the substrate in a second (or Y) direction. The controller 2208 and/or the RTP controller 2210 may move the mirrors 2214, 2216 via motors 2230, 2232.

The tele-centric lens assembly 2218 may include a series of plano-convex lenses 2240, 2242, 2244, 2246. Although a particular number of plano-convex lenses are shown, a different number of plano-convex lenses may be included. The diameter of the plano-convex lenses 2240, 2242, 2244, 2246 increases the closer the plano-convex lens is to the window assembly 130, such that: a diameter of the lens 2242 is larger than a diameter of the lens 2240; a diameter of the lens 2244 is larger than the diameter of the lens 2242; and a diameter of the lens 2246 is larger than the diameter of the lens 2244. The plano-convex lenses 2240, 2242, 2244, 2246 are vertically aligned to have a common centerline 2248. The plano-convex lenses 2240, 2242, 2244, 2246 are held in a fixed relationship within a mold 2250. The plano-convex lenses 2240, 2242, 2244, 2246 direct the laser beam received from the second mirror 2216 to be orthogonal to the surface of the substrate 112. As the laser beam is moved across the surface of the substrate 112, the tele-centric lens assembly 2218 maintains the laser beam in an orthogonal relationship with the surface of the substrate 112.

As an example, a laser beam out of the beam shaping optics 2212, the acousto-optic modulator 2223 and/or the beam size adjustment device 2226 may be focused at the a center 2252 of the second mirror 2216 and then be directed through the tele-centric lens assembly 2218, where the laser beam is collimated and provided to the substrate 112. Focusing the laser at an input pupil of the second mirror (or lens) 2216 aids in providing a collimated beam at an upward facing surface of the substrate 112.

As an example, the laser beam generated by the laser 2204 may be 355 nm in diameter. The laser 2204 may operate in the pulse mode or the CW mode. The beam shaping optics 2212, the beam size adjustment device 2227, and the tele-centric lens assembly 2218 may generate a 2 centimeter by 2 centimeter square beam that is received at the substrate 112. The RTP controller 2210 may move the mirrors 2214, 2216 to perform a 200 Hz scan across a surface of the substrate 112. The RTP controller 2210 may scan over all dies and/or an upward facing surface area (e.g., for a 300 mm diameter substrate, the $2.83 \times 10^5$ mm upward facing surface area of the substrate) within a 1 second period of time. This may include scanning over, for example, 160 dies of the substrate within 1 second. The scanning includes moving the laser beam from die-to-die and heating each die for a predetermined period of time (e.g., an overall period of one or more pulses of the laser beam).

The substrate processing system 2200 may include the temperature control system 150, which may be used to control a temperature of the substrate support 110 and the substrate 112. The temperature control system 150 may include the one or more temperature sensors 156 to sense temperatures of one or more locations or zones of the substrate support 110.

Figure 23:
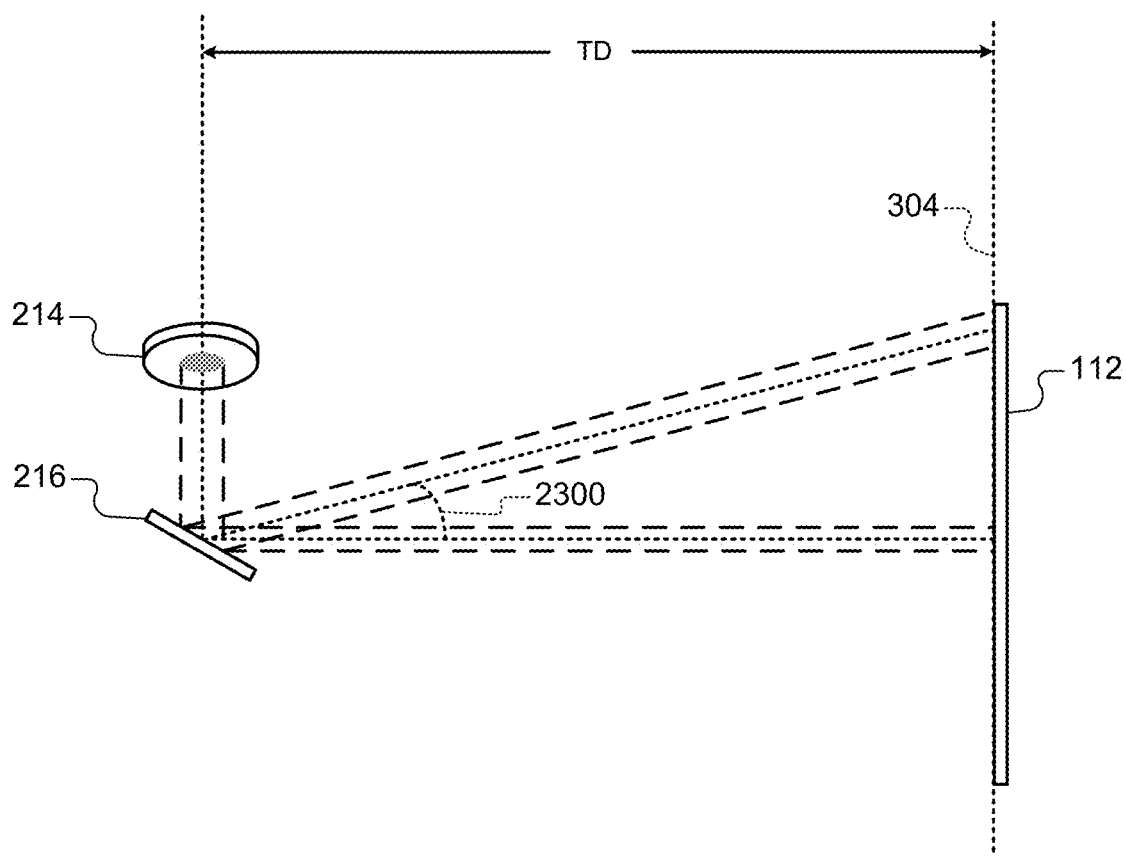
FIG. 23 is a side view of mirrors and a substrate illustrating an incident angle in accordance with an embodiment of the present disclosure.

A tele-centric lens assembly, as shown in FIG. 3, can be expensive to implement. A laser beam can be collimated without use of a tele-centric lens assembly. As an example and referring to FIG. 23, the tele-centric lens assembly 218 of FIG. 3 may be removed and the mirror 216 is moved away from the image plane 304 in order to collimate the laser beam. In order to collimate the laser beam and minimize the angles at which light rays are directed at the substrate 112 (or angles away from a direction orthogonal to the image plane 304), a transmission distance TD between the mirror 216 and the image plane 304 is maximized and/or set above a predetermined minimum distance. If the light rays are directed in a direction orthogonal to the image plane 304, then an ideal laser beam condition exists for etch rate uniformity across a surface of the substrate 112. If the light rays are directed at angles within a small predetermined range of being orthogonal (e.g., 90°±3°), then the laser beam is sufficiently collimated to provide surface etching uniformity above a predetermined minimum uniformity level. To direct the light rays of a laser beam, such that angles of the lights rays are within the predetermined range, the distance TD is set greater than or equal to a predetermined length (e.g., 3 meters). The larger the distance TD, the smaller the angles and thus the more collimated the laser beam. FIG. 23 shows when (i) the laser beam is directed at a center of the substrate 112, and (ii) when the laser beam is directed towards an edge of the substrate 112. An incident angle 2300 between these two transmissions decreases the further the mirror 216 is from the image plane 304.

Figure 24:
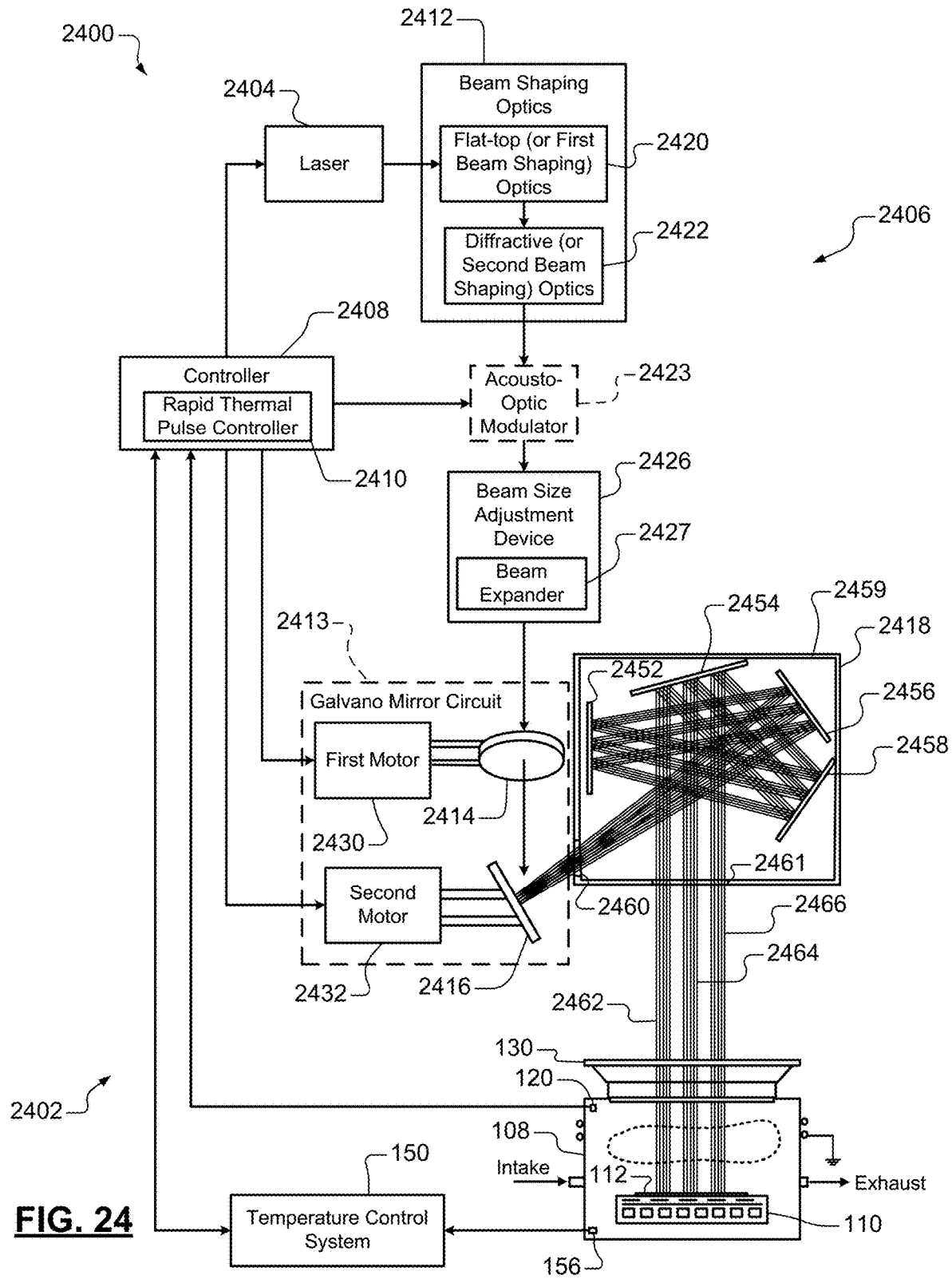
FIG. 24 is a functional block diagram of an example of a substrate processing system incorporating a optical beam folding assembly in accordance with an embodiment of the present disclosure.

In order to reduce the distance between the mirror 216 and at the same time collimate the laser beam, an optical beam folding assembly may be incorporated between the mirror 216 and the image plane 304. The optical beam folding assembly improves tele-centricity. An example of this is shown in FIG. 24. FIG. 24 shows an example of a substrate processing system 2400 incorporating a RTP system 2402 including a laser 2404, a lens circuit 2406 and a controller 2408 with a RTP controller 2410. The substrate processing system 2400 may operate similar to the substrate processing system 200 of FIG. 2 and the substrate processing system 2200 of FIG. 22. The laser 2404 is a heat source that may be pulsed (or modulated) by the RTP controller 2410 during RTP operations based on a control signal received from the RTP controller 2410. This may occur during ALE and ALD processes.

The lens circuit 2406 includes beam shaping optics 2412, a Galvano mirror circuit 2413 that includes a first mirror 2414 and a second mirror 2416, and an optical beam folding assembly 2418. The beam shaping optics 2412 may include flat-top (or first beam shaping) optics 2420 and diffractive (or second beam shaping) optics 2422. The flat-top optics 2420 are used to convert a laser beam received from the laser 2404, where the laser beam has a Gaussian distribution, into a flat-top beam (e.g., a 2 centimeter (cm)×2 cm flat-top beam). A temperature profile of the laser beam is also Gaussian. The diffractive optics 2422 convert the flat-top circular beam out of the flat-top optics 2420 to a square beam. The square beam has a corresponding uniform temperature distribution on a substrate 112. The substrate 112 may be disposed on the substrate support in the processing chamber 108.

The laser 2404 may be operated in a pulse mode or a continuous wave (CW) mode. During the pulse mode, the output of the beam shaping optics 2412 may be provided directly to the beam size adjustment device 2426. During the pulse mode, the RTP controller 2410 may control a pulse rate of the laser beam, such that pulse duration is in a pico-second or a nano-second range. An acousto-optic modulator 2423 may be included when the laser 2404 is being operated in the CW mode. The acousto-optic modulator 2423 may be controlled by the RTP controller 2410. In one embodiment, the RTP controller 2410 generates a RF control signal, which is provided to the acousto-optic modulator 2423. The RF control signal is provided to control a change in a refractive index of a crystal of the acousto-optic modulator 2423. The refractive index of the crystal changes based on a frequency of the RF control signal. The laser beam provided from the beam shaping optics 2412 to the acousto-optic modulator 2423 is deflected by the crystal based on a frequency of the RF signal. The crystal performs as a laser shutter that permits or prevents passage of the laser beam to the beam size adjustment device 2426 and/or the first mirror 2414. In one embodiment, the RTP controller 2410 controls the frequency of the RF control signal, such that the continuous wave laser beam out of the beam shaping optics 2412 is effectively pulsed (or modulated) by the acousto-optic modulator 2423. The laser beam is pulsed, such that a period of each pulse is in a micro-second or a milli-second range. As a result, use of the acousto-optic modulator 2423 allows for pulsed laser beam generation having longer duration pulses for increased heating per pulse.

The beam size adjustment device 2426 may be disposed between the beam shaping optics 2412 and the first mirror 2414. The beam size adjustment device 2426 may adjust a size of the square beam to be greater than or equal to a size of a die on the substrate 112. The beam size adjustment device 2426 may be motorized and include a beam expander 2427.

The RTP controller 2410 and the Galvano mirror circuit 2413 may operate as a X-Y galvanometer scanning system. The first mirror 2414 may be used to move the laser beam across a surface of the substrate 112 in a first (or X) direction. The second mirror 2416 may be used to move the laser beam across the surface of the substrate in a second (or Y) direction. The controller 2408 and/or the RTP controller 2410 may move the mirrors 2414, 2416 via motors 2430, 2432.

The optical beam folding assembly 2418 may include a set of mirrors for reflecting a received laser beam. The optical beam folding assembly 2418 may include any number of mirrors. As an example, 4 mirrors 2452, 2454, 2456, 2458 are shown. The mirrors may have different sizes, be positioned at different angles, and be positioned in different locations within a housing 2459. The housing 2459 may have a first (or input) window 2460 and a second (or output) window 2461 through which a laser beam is passed. In the example shown, three laser beams 2462, 2464, 2466 are shown; each of which having respective light rays. The three laser beams are provided at respective times and by moving the mirrors 2414, 2416 to respective positions. Any number of laser beams may be generated. In one embodiment, the Galvano mirror circuit is included in the housing 2459. The Galvano mirror circuit 2413 in combination with the optical beam folding assembly 2418 or the optical beam folding assembly 2418 alone may be referred to as a collimating assembly.

The optical beam folding assembly 2418 increases the distance that the laser beam travels from the second mirror 2416 to the substrate 112 while minimizing distance between the second mirror 2416 and the substrate 112. The increased travel distance collimates the laser beam prior to being received at the substrate. This provides a compact design. The optical beam folding assembly 2418 is also less expensive to manufacture than a tele-centric lens assembly.

The set of mirrors of the optical beam folding assembly 2418 are positioned and oriented to direct the laser beam received from the second mirror 2416 to be orthogonal (or within a predetermined angle of 90° relative) to the surface of the substrate 112. As the laser beam is moved across the surface of the substrate 112, the optical beam folding assembly 2418 maintains the laser beam in this orthogonal or semi-orthogonal relationship with the surface of the substrate 112.

As an example, a laser beam out of the beam shaping optics 2412, the acousto-optic modulator 2423 and/or the beam size adjustment device 2426 may be focused at the a center of the second mirror 2416 and then be directed through optical beam folding assembly 2418, where the laser beam is collimated and provided to the substrate 112. Focusing the laser at an input pupil of the second mirror (or lens) 2416 aids in providing a collimated beam at an upward facing surface of the substrate 112.

As an example, the laser beam generated by the laser 2404 may be 355 nm in diameter. The laser 2404 may operate in the pulse mode or the CW mode. The beam shaping optics 2412, the beam size adjustment device 2427, and the optical beam folding assembly 2418 may generate a 2 centimeter by 2 centimeter square beam that is received at the substrate 112. The RTP controller 2410 may move the mirrors 2414, 2416 to perform a 200 Hz scan across a surface of the substrate 112. The RTP controller 2410 may scan over all dies and/or an upward facing surface area (e.g., for a 300 mm diameter substrate, the $2.83 \times 10^5$ mm upward facing surface area of the substrate) within a 1 second period of time. This may include scanning over, for example, 160 dies of the substrate within 1 second. The scanning includes moving the laser beam from die-to-die and heating each die for a predetermined period of time (e.g., an overall period of one or more pulses of the laser beam).

The substrate processing system 2400 may include the temperature control system 150, which may be used to control a temperature of the substrate support 110 and the substrate 112. The temperature control system 150 may include the one or more temperature sensors 156 to sense temperatures of one or more locations or zones of the substrate support 110.

The processes of ALD and ALE depend on iteratively performing a first operation A followed by a second operation B with a pump/purge operation being performed between operations A and B. This is true independent of the type of heat source utilized. For example, a full substrate surface may be dosed with a first gas to form a saturated monolayer. Any residual amount of the first gas may then be pumped out of a corresponding process chamber. The full substrate surface may then be exposed to second gas and/or an energy source (e.g. energetic ions or ultra-violet photons) followed by a pumping out of product (or remaining) gases. These operations may then be repeated until a predetermined deposited film thickness is obtained or a predetermined etched depth is reached.

For laser-based substrate processing, a laser beam is focused to an area much smaller than that of an upward facing surface area of a substrate (e.g., a 300 mm in diameter substrate having a upward facing surface area of approximately 2800 $cm^2$) in order to heat the surface to a predetermined temperature. In addition, an amount of time to perform pulsed laser annealing (a predetermined number of picoseconds or nanoseconds) is several orders of magnitude smaller than the few seconds typically needed to (i) dose an upper surface of a wafer the full wafer, or (ii) pump out gases in the processing chamber.

Thus, by using the implementations disclosed above, a laser beam may be focused to a size of a chip (or die) of a substrate and the laser beam is then stepped over a surface of the substrate and pulse synchronized with an amount of time involved to reposition the laser beam. Thus, the laser beam is ON when over a chip and is OFF while being transitioned to a next chip.

For example, if a chip has an upward facing surface area of 1 cm×1 cm, then the size of the generated laser beam is also 1 cm×1 cm. As an example, the surface area of a substrate may be dosed followed by pumping out gases and then the laser beam may be stepped from one chip to the next using one of the substrate processing systems disclosed herein. The laser beam may be pulsed ON over each of the chips in succession. Subsequent to pulsing the laser ON over each of the chips of the substrate, the substrate may then be dosed again and this process may be repeated until a predetermined etch depth or a predetermined deposited thickness has been reached for each die. The laser beam may be stepped over all of the chips of a substrate in less than 1-3 seconds, which is similar to an amount of time associated with gas dosing and gas purging operations. Thus, laser annealing time is reduced and substrate throughput is high and inexpensive. This also decreases ON time of the laser and the ratio of time to perform an annealing process on the chips of a substrate relative to the amount of time associated with corresponding dosing and purging.

In one embodiment, a duty cycle of a laser is synchronized with time to steer the associated laser beam from die to die. For example, if there are 160 2 cm-by-2 cm dies on a substrate, then a center of the laser beam is repositioned a distance of a little more than approximately 2 cm (or width of a die plus a gap between adjacent dies) between each laser pulse. If the whole substrate is scanned in a 1 second period of time, then the time associated with each laser pulse cycle is 1/160 seconds.

As an example, an entire substrate may be dosed, gases are pumped out of a corresponding processing chamber, and the laser is stepped from one die to the next pulsing ON over each die in succession. The substrate may then be dosed again and the process is repeated. This provides a quick annealing process. If laser annealing of a full substrate surface took a long time (e.g. 10 minutes), then substrate throughput would be low and expensive. By providing a laser annealing process where a full substrate surface is scanned in a short period of time (e.g., 1 second), the time gating items are substrate dosing and gas purging rather than laser annealing.

The examples provide high selective ALE with high throughput with improved layer thickness control. Pulsed laser operation allows for plasma or gas phase processes in-situ. Multiple cycles of surface modification and isotropic removal are performed with nano-scale selectivity with short process times. Fast pulsed thermal ALE is performed in a single processing chamber without a thermal budget problem. Tele-centric and optical beam folding examples are disclosed that allow for maintaining vertical irradiation on a substrate surface without beam distortion while providing a substantially uniform temperature profile across the substrate surface.

Figure 25:
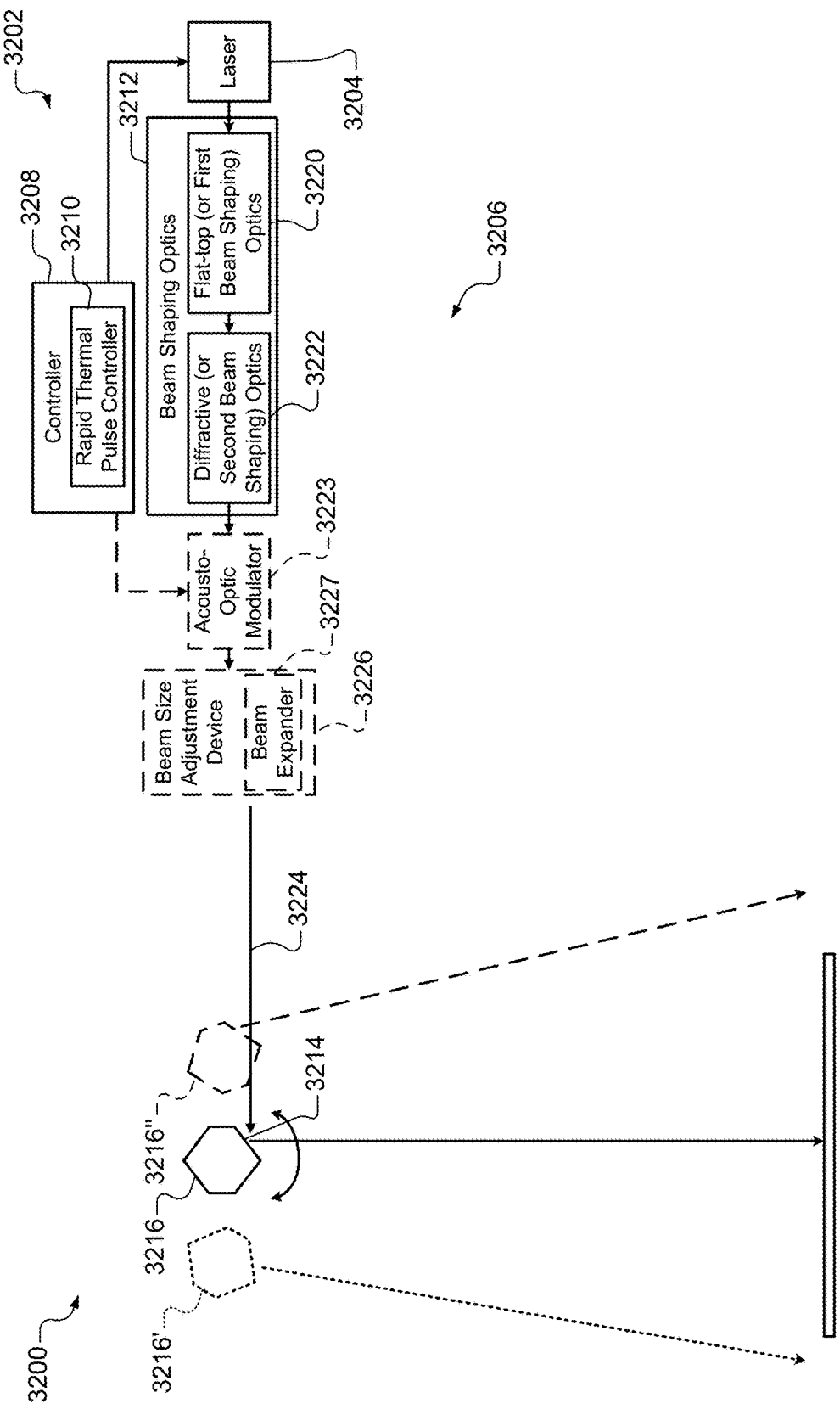
FIG. 25 is a functional block diagram of an example of a substrate processing system incorporating circular-to-line beam shaping optics and at least one of a mirror or a polygon scanner in accordance with an embodiment of the present disclosure.

FIG. 25 shows a substrate processing system 3200 incorporating a RTP system 3202 including a laser 3204, a lens circuit 3206 and a controller 3208 with a RTP controller 3210. The substrate processing system 3200 may operate similar to the substrate processing system 200 of FIG. 2, the substrate processing system 2200 of FIG. 22 and/or the substrate processing system 2400 of FIG. 24. The laser 3204 is a heat source that may be pulsed (or modulated) by the RTP controller 3210 during RTP operations based on a control signal received from the RTP controller 3210. This may occur during ALE and ALD processes.

The lens circuit 3206 includes beam shaping optics 3212 and at least one of a mirror 3214 and a polygon scanner 3216. In one embodiment, the mirror 3214 is included and the polygon scanner 3216 is not included. In another embodiment, the mirror 3214 is implemented as one side of the polygon scanner 3216. The polygon scanner 3216 may have one or more mirrors. In one embodiment each side surface of the polygon scanner 3216 has a mirror. In the example shown, the polygon scanner has 6 side surfaces and two end surfaces. The polygon scanner may have any number of sides. In one embodiment, the mirror 3214 is rotated via a motor, such as one of the motors of FIGS. 2, 22, 24. In another embodiment, the polygon scanner 3216 is rotated via the motor.

The motor may be unidirectional or bi-directional, such that a shaft of the motor may be driven in forward and reverse directions. The motor may rotate the mirror and/or polygon scanner, such that a laser beam is no longer being reflected off a first portion of a first mirror, but rather is reflected off a second portion of the first mirror. The shaft of the motor may then be returned to the initial position, such that the laser beam is reflected off the first portion of the first mirror, or may be rotated such that the laser beam is reflected off a different mirror. In one embodiment, the motor is uni-directional and thus the shaft of the motor is rotated in a same direction. Instead of rotating the shaft in a reverse direction and returning to an initial position when rescanning a substrate, the polygon scanner may be rotated such that the laser beam is reflected off of the next adjacent mirror on the polygon scanner. This can have a same effect as returning to the initial position.

Figure 26:
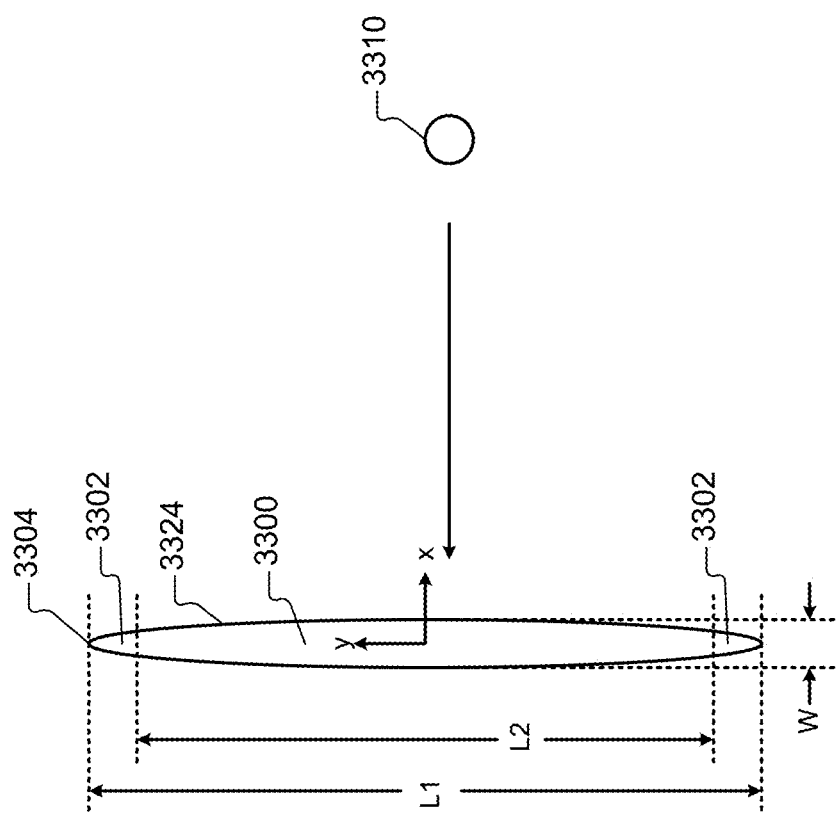
FIG. 26 is a cross-sectional view of a circular beam and a line beam in accordance with an embodiment of the present disclosure.

The beam shaping optics 3212 may include flat-top (or first beam shaping) optics 3220 and second beam shaping optics 3222. The flat-top optics 3220 are used to convert a laser beam received from the laser 3204, where the laser beam has a Gaussian distribution, into a flat-top beam. A temperature profile of the laser beam is also Gaussian. The second beam shaping optics 3222 convert the flat-top circular beam out of the flat-top optics 3220 to a line beam 3224 having an oval-shaped cross section, as shown in FIG. 26. The line beam 3224 may have a Gaussian intensity and/or temperature distribution in a first (or x) direction and a substantially "flat-top" or uniform intensity and/or temperature distribution in a second (or y) direction. The length L1 of the cross-section of the line beam 3324 in the y direction may be greater than a diameter of the substrate 112. As an example, the length L1 may be 320 mm and the diameter of the substrate may be 300 mm. In one embodiment, the line beam 3324 has (i) a substantially "flat-top" or uniform intensity in a center portion 3300 of the line beam 3324 and provides a uniform temperature distribution over a surface of the substrate 112, and (ii) end portions 3302 with sharply decreasing in intensity distributions from the center portion 3300 to a radially outermost edge 3304 of the substrate 112. In FIG. 26, the center portion 3300 of the cross-section of the line beam 3324 has a length L2, which is equal to or nearly the same as the diameter of the substrate 112. The substrate 112 may be disposed on a substrate support (e.g., the substrate support 110 of FIG. 1).

In the example shown in FIG. 25, the polygon scanner 3216 is shown in three rotated positions, two of which are illustrated by dashed representations 3216' and 3216". Although the representations 3216' and 3216" are shown to the left and right of the polygon scanner 3216, in actuality the polygon scanner is stationary and is simply rotated to scan over the substrate 112. This provides one-dimensional movement of the line beam across the substrate 112 for a quick scan (i.e. short scan times). No tele-centric lens assembly and/or optical beam folding assembly is utilized for the embodiment of FIG. 25.

The laser 3204 may be operated in a pulse mode or a continuous wave (CW) mode. During the pulse mode, the output of the beam shaping optics 3212 may be provided directly to a beam size adjustment device 3226. During the pulse mode, the RTP controller 3210 may control a pulse rate of the laser beam, such that pulse duration is in a pico-second or a nano-second range. An acousto-optic modulator 3223 may be included when the laser 3204 is being operated in the CW mode. The acousto-optic modulator 3223 may be controlled by the RTP controller 3210. In one embodiment, the RTP controller 3210 generates a RF control signal, which is provided to the acousto-optic modulator 3223. The RF control signal is provided to control a change in a refractive index of a crystal of the acousto-optic modulator 3223. The refractive index of the crystal changes based on a frequency of the RF control signal. The laser beam provided from the beam shaping optics 3212 to the acousto-optic modulator 3223 is deflected by the crystal based on a frequency of the RF signal. The crystal performs as a laser shutter that permits or prevents passage of the laser beam to the beam size adjustment device 3226, the mirror 3214 and/or the polygon scanner 3216. In one embodiment, the RTP controller 3210 controls the frequency of the RF control signal, such that the continuous wave laser beam out of the beam shaping optics 3212 is effectively pulsed (or modulated) by the acousto-optic modulator 3223. The laser beam is pulsed, such that a period of each pulse is in a micro-second or a milli-second range. As a result, use of the acousto-optic modulator 3223 allows for pulsed laser beam generation having longer duration pulses for increased heating per pulse.

The beam size adjustment device 3226 may be disposed between the beam shaping optics 3212 and the mirror 3214 and/or the polygon scanner 3216. The beam size adjustment device 3226 may adjust a size of the line beam to be greater than a diameter of the substrate 112. The beam size adjustment device 3226 may be motorized and include a beam expander 3227.

The RTP controller 3210, the mirror 3214 and/or the polygon scanner 3216 may operate as a uni-dimensional scanning system. The mirror 3214 and/or the polygon scanner 3216 may be rotated to move the laser/line beam 3224 across the surface of the substrate 112 in, for example, a first (or X) direction. The controller 3208 and/or the RTP controller 3210 may rotate the mirror 3214 and/or the polygon scanner 3216 via a corresponding motor, as described above to scan across the surface of the substrate 112. In each position of the line beam on the surface of the substrate, the line beam heats portions of the dies of the substrate 112 in a y-direction. One or more pulses may be generated at each position of the line beam. The line beam may be cycled across the surface multiple times to remove a predetermined thickness (or thicknesses) of material from the substrate 112.

FIG. 26 shows cross-sectional views of a circular beam 3310 and the line beam 3324. The beam shaping optics 3212 convert the circular beam 3310, which may be outputted from the laser 3204 of FIG. 25, to the line beam 3224. The line beam has an oval-shaped cross section and may have a Gaussian distribution in the x-direction and a substantially uniform distribution in the y-direction. As an example, an incident angle between when the line beam is directed at a center of the substrate 112 and when the line beam is directed at a point near a radially outermost edge of the substrate 112 may be 8.53°. Normal energy density of the line beam at the center position may be 1 and at the radially outermost edge position may be 0.989. Beam size deviation between the two positions may be 1.12 μm.

Figure 27:
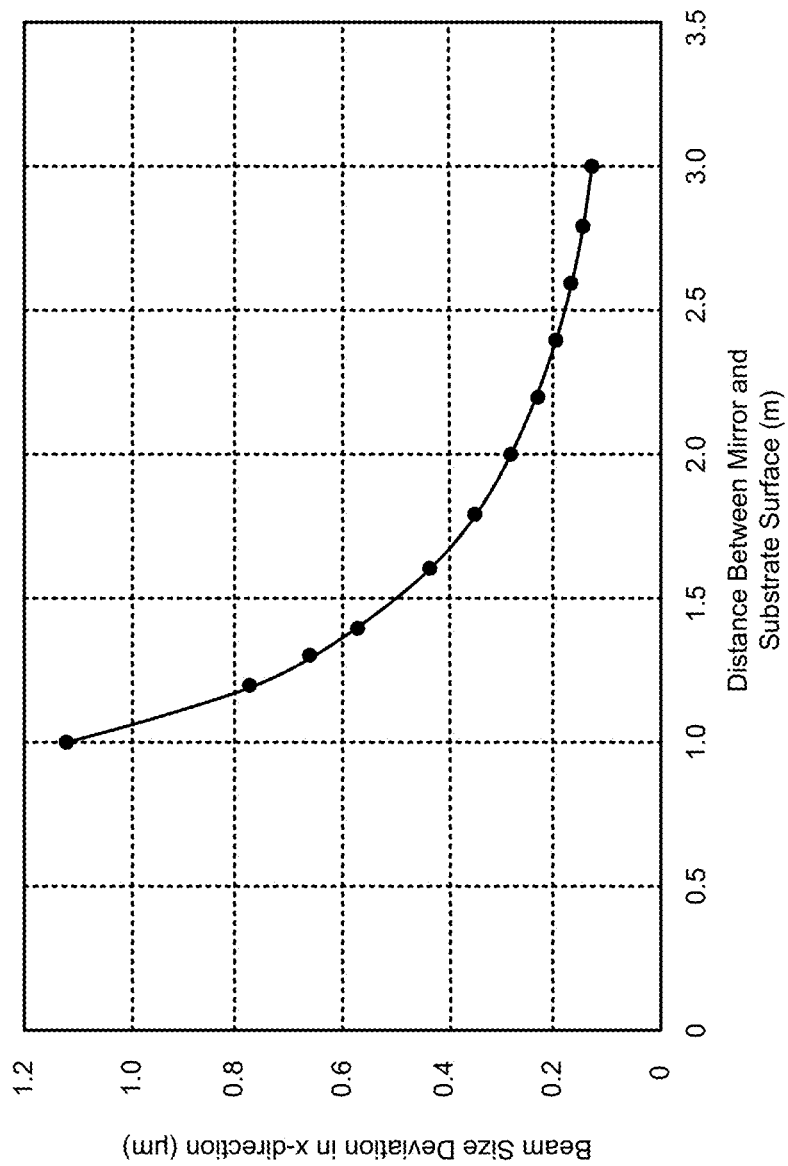
FIG. 27 is a plot of line beam size deviation versus distance between a mirror and a substrate surface in accordance with an embodiment of the present disclosure.

FIG. 27 shows a plot of line beam size deviation in the x-direction (or lateral direction) versus distance between a mirror and a substrate surface. There is minimal or no deviation in size along the y-direction (or longitudinal direction). This plot is applicable to the embodiment of FIGS. 25 and 26. The further the mirror 3214 and/or the polygon scanner 3216 is from the surface of the substrate 112, the less variation in beam size when the line beam 3224 is moved from a center of the substrate 112 to a radially outermost edge of the substrate 112. Also, the difference in variation between when the mirror 3214 and/or the polygon scanner 3216 is 1-3 meters (m) from the surface of the substrate is minimal (e.g., 1 μm). Thus, the substrate 112 may be closely positioned relative to the mirror 3214 and/or the polygon scanner 3216.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from multiple fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
a processing chamber;
a substrate support disposed in the processing chamber and configured to support a substrate;
a laser configured to generate a laser beam;
a collimating assembly comprising a plurality of lenses or mirrors arranged to direct the laser beam at the substrate to heat an exposed material of the substrate, wherein the plurality of lenses or mirrors are configured to direct the laser beam in a direction within a predetermined range of being perpendicular to a surface of the substrate; and
a controller configured to perform a rapid thermal annealing process including (i) generating a control signal to modulate the laser beam to subject the exposed material to a plurality of thermal energy pulses, and (ii) allowing the exposed material to cool between consecutive ones of the plurality of thermal enemy pulses.

2. The substrate processing system of claim 1, further comprising a lens circuit comprising:
flat-top optics to convert the laser beam from a round-shaped laser beam to a flat-top shaped laser beam; and diffractive optics to convert the flat-top shaped laser beam to a square-shaped laser beam.

3. The substrate processing system of claim 1, further comprising a mirror circuit comprising a first mirror, a second mirror, a first motor and a second motor,
wherein the controller is configured to move the first mirror and the second mirror via the first motor and the second motor to adjust a position of the laser beam on the substrate.

4. The substrate processing system of claim 1, further comprising a beam size adjustment device configured to adjust a size of the laser beam prior to being received by the substrate.

5. The substrate processing system of claim 1, wherein:
the collimating assembly comprises a tele-centric lens assembly comprising the plurality of lenses arranged to direct the laser beam at the substrate to heat the exposed material; and
the plurality of lenses are configured to direct the laser beam in a direction perpendicular to the surface of the substrate.

6. The substrate processing system of claim 5, further comprising a mirror circuit comprising a first mirror, a second mirror, a first motor and a second motor, wherein:
the laser beam is directed at the first mirror;
the laser beam is directed from the first mirror to the second mirror;
the laser beam is directed from the second mirror through the tele-centric lens assembly and to the substrate; and
the controller is configured to move the first mirror and the second mirror via the first motor and the second motor to adjust a position of the laser beam on the substrate.

7. The substrate processing system of claim 6, wherein the plurality of lenses maintain the laser beam in a perpendicular relationship with the surface of the substrate while the controller adjusts the position of the laser beam on the substrate.

8. The substrate processing system of claim 5, wherein:
the processing chamber is an inductively coupled plasma chamber or a remote plasma source connected chamber; and
the tele-centric lens assembly is disposed above a dielectric window of the processing chamber.

9. The substrate processing system of claim 5, wherein the plurality of lenses are plano-convex lenses.

10. The substrate processing system of claim 5, wherein the plurality of lenses have different diameters.

11. The substrate processing system of claim 10, wherein:
the plurality of lenses are arranged in a series including a first lens and a last lens;
the plurality of lenses increase in diameter from the first lens to the last lens; and
the laser beam is received at the first lens and is output from the last lens to the substrate.

12. The substrate processing system of claim 1, wherein:
the collimating assembly comprises an optical beam folding assembly comprising the plurality of mirrors arranged to direct the laser beam at the substrate to heat the exposed material, wherein the plurality of lenses are configured to direct the laser beam in a direction perpendicular to the surface of the substrate; and
the plurality of mirrors are arranged to reflect and direct the laser beam in a direction within the predetermined range of being perpendicular to the surface of the substrate.

13. The substrate processing system of claim 1, wherein the controller is configured to control the laser to pulse the laser beam at a predetermined frequency.

14. The substrate processing system of claim 1, further comprising a gas delivery system configured to supply a process gas to the processing chamber,
wherein the controller is configured to control the gas delivery system and the laser to iteratively perform an isotropic atomic layer etch process including
during an iteration of the isotropic atomic layer etch process, performing pretreatment, atomistic adsorption, and pulsed thermal annealing,
during the atomistic adsorption, exposing the surface of the substrate to the process gas including a halogen species that is selectively adsorbed onto the exposed material of the substrate to form a modified material, and
during the pulsed thermal annealing, pulsing the laser on and off a plurality of times within a predetermined period to expose and remove the modified material.

15. The substrate processing system of claim 1, further comprising an acousto-optic modulator configured to receive the laser beam, wherein:
the controller is configured to generate a radio frequency signal;
the laser is configured to operate in a continuous mode; and
the acousto-optic modulator is configured to, based on the radio frequency signal and at a predetermined frequency, switch between permitting passage and preventing passage of the laser beam to the plurality of lenses or mirrors.

16. The substrate processing system of claim 15, wherein:
the collimating assembly comprises an optical beam folding assembly comprising the plurality of mirrors arranged to direct the laser beam at the substrate to heat the exposed material, wherein the plurality of lenses are configured to direct the laser beam in a direction perpendicular to the surface of the substrate; and
the plurality of mirrors are arranged to reflect and direct the laser beam in a direction within the predetermined range of being perpendicular to the surface of the substrate.

17. The substrate processing system of claim 15, further comprising a gas delivery system configured to supply a process gas to the processing chamber,
wherein the controller is configured to control the gas delivery system and the laser to iteratively perform an isotropic atomic layer etch process including
during an iteration of the isotropic atomic layer etch process, performing pretreatment, atomistic adsorption, and pulsed thermal annealing,
during the atomistic adsorption, exposing the surface of the substrate to the process gas including a halogen species that is selectively adsorbed onto the exposed material of the substrate to form a modified material, and
during the pulsed thermal annealing, generate the radio frequency signal to modulate the laser beam within a predetermined period to expose and remove the modified material.

18. A substrate processing system comprising:
a processing chamber;
a substrate support disposed in the processing chamber and configured to support a substrate;
a laser configured to generate a laser beam;

at least one of a mirror or a polygon scanner arranged to direct the laser beam at a surface of the substrate to heat an exposed material of the substrate; and a controller configured to perform an isotropic atomic layer etch process including performing pretreatment, atomistic adsorption and pulsed thermal annealing, wherein the controller is configured form a modified material during the atomistic adsorption, and during the pulsed thermal annealing, to at least one of i) pulsing the laser on and off a plurality of times within a predetermined period to expose and remove the modified material, and ii) generating a radio frequency signal to modulate the laser beam within a predetermined period to expose and remove the modified material.

19. The substrate processing system of claim 18, wherein the at least one of the mirror or the polygon scanner is configured to direct the laser beam in a direction within a predetermined range of being perpendicular to the surface of the substrate.

20. The substrate processing system of claim 18, further comprising a lens circuit comprising:

flat-top optics configured to convert a round-shaped laser beam to a flat-top shaped laser beam; and beam shaping optics configured to convert the flat-top shaped laser beam to a line beam.

21. The substrate processing system of claim 18, wherein:
the polygon scanner includes a plurality of sides; and
each of the plurality of sides is implemented as a mirror or includes a mirror.

22. The substrate processing system of claim 21, further comprising a motor connected to and configured to rotate the polygon scanner, wherein the controller is configured to control operation of the motor to rotate the polygon scanner to move the laser beam across the surface of the substrate.

23. The substrate processing system of claim 18, further comprising a motor connected to and configured to rotate the mirror, wherein the controller is configured to control operation of the motor to rotate the mirror to move the laser beam across the surface of the substrate.

24. The substrate processing system of claim 18, further comprising a gas delivery system configured to supply a process gas to the processing chamber, wherein the controller is configured to control the gas delivery system and the laser to iteratively perform the isotropic atomic layer etch process including during an iteration of the isotropic atomic layer etch process, performing the pretreatment, the atomistic adsorption, and the pulsed thermal annealing, during the atomistic adsorption, exposing the surface of the substrate to the process gas including a halogen species that is selectively adsorbed onto the exposed material of the substrate to form the modified material, and during the pulsed thermal annealing, pulsing the laser on and off the plurality of times within the predetermined period to expose and remove the modified material.

25. The substrate processing system of claim 18, further comprising an acousto-optic modulator configured to receive the laser beam, wherein:

the controller is configured to generate the radio frequency signal;

the laser is configured to operate in a continuous mode, and the acousto-optic modulator is configured to, based on the radio frequency signal and at a predetermined frequency, switch between permitting passage and preventing passage of the laser beam to the polygon scanner.

26. The substrate processing system of claim 25, further comprising a gas delivery system configured to supply a process gas to the processing chamber, wherein the controller is configured to control the gas delivery system and the laser to iteratively perform the isotropic atomic layer etch process including during an iteration of the isotropic atomic layer etch process, performing the pretreatment, the atomistic adsorption, and the pulsed thermal annealing, during the atomistic adsorption, exposing the surface of the substrate to the process gas including a halogen species that is selectively adsorbed onto the exposed material of the substrate to form the modified material, and during the pulsed thermal annealing, generate the radio frequency signal to modulate the laser beam within the predetermined period to expose and remove the modified material.

* * * * *